(12) United States Patent
Kudou

(10) Patent No.: US 8,748,977 B2
(45) Date of Patent: Jun. 10, 2014

(54) SEMICONDUCTOR DEVICE AND METHOD FOR PRODUCING SAME

(75) Inventor: Chiaki Kudou, Hyogo (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/982,648

(22) PCT Filed: Mar. 14, 2012

(86) PCT No.: PCT/JP2012/001791
§ 371 (c)(1),
(2), (4) Date: Jul. 30, 2013

(87) PCT Pub. No.: WO2012/127821
PCT Pub. Date: Sep. 27, 2012

(65) Prior Publication Data
US 2013/0306982 A1 Nov. 21, 2013

(30) Foreign Application Priority Data
Mar. 23, 2011 (JP) .................. 2011-064544

(51) Int. Cl.
| | |
|---|---|
| *H01L 29/66* | (2006.01) |
| *H01L 29/423* | (2006.01) |
| *H01L 29/78* | (2006.01) |
| *H01L 21/28* | (2006.01) |
| *H01L 29/06* | (2006.01) |
| *H01L 29/739* | (2006.01) |
| *H01L 29/16* | (2006.01) |
| *H01L 29/20* | (2006.01) |

(52) U.S. Cl.
CPC ......... *H01L 29/0607* (2013.01); *H01L 29/1608* (2013.01); *H01L 29/4238* (2013.01); *H01L 29/1602* (2013.01); *H01L 29/66734* (2013.01); *H01L 29/7813* (2013.01); *H01L 21/28008* (2013.01); *H01L 29/42368* (2013.01); *H01L 29/66068* (2013.01); *H01L 29/4236* (2013.01); *H01L 29/66045* (2013.01); *H01L 29/7397* (2013.01); *H01L 29/7827* (2013.01); *H01L 29/2003* (2013.01)
USPC ........ 257/330; 257/76; 257/329; 257/E21.41; 438/259; 438/589; 438/270; 438/212

(58) Field of Classification Search
USPC .............. 257/76, 330, 329, E21.41; 438/589, 438/259, 270, 212
See application file for complete search history.

(56) References Cited

U.S. PATENT DOCUMENTS

| | | |
|---|---|---|
| 5,915,180 A | 6/1999 | Hara et al. |
| 6,228,720 B1 | 5/2001 | Kitabatake et al. |

(Continued)

FOREIGN PATENT DOCUMENTS

| | | |
|---|---|---|
| JP | 03-203350 A | 9/1991 |
| JP | 07-326755 A | 12/1995 |

(Continued)

OTHER PUBLICATIONS

International Search Report for corresponding International Application No. PCT/JP2012/001791 mailed May 22, 2012.

(Continued)

*Primary Examiner* — Jarrett Stark
*Assistant Examiner* — Shahed Ahmed
(74) *Attorney, Agent, or Firm* — Renner, Otto, Boisselle & Sklar, LLP

(57) ABSTRACT

A semiconductor device according to an embodiment of the present invention includes: a semiconductor layer 2 of a wide band gap semiconductor arranged on a principal surface of a substrate 1; a trench 5 arranged in the semiconductor layer and including a bottom surface, a plurality of main side surfaces, and a plurality of corner side surfaces each connecting together two adjacent main side surfaces; a gate insulating film 6 arranged on the bottom surface, the main side surfaces and the corner side surfaces of the trench 5; and a gate electrode 8 arranged in the trench, wherein the semiconductor layer includes a drift region 2d of a first conductivity type, and a body region 3 of a second conductivity type arranged on the drift region; the trench runs through the body region 3 and has the bottom surface inside the drift region; the corner side surfaces of the trench do not have a depressed portion; the gate insulating film 6 is thicker on the corner side surfaces of the trench than on the main side surfaces of the trench; and a portion of the gate insulating film 6 that is located on the corner side surfaces is a first insulating layer 6b, and a portion of the gate insulating film 6 that is located on the main side surfaces is a second insulating layer 6a.

17 Claims, 32 Drawing Sheets

(56) References Cited

U.S. PATENT DOCUMENTS

| | | | |
|---|---|---|---|
| 6,268,629 B1 * | 7/2001 | Noguchi | 257/345 |
| 8,076,720 B2 * | 12/2011 | Shimada et al. | 257/330 |
| 2001/0053561 A1 | 12/2001 | Kitabatake et al. | |
| 2002/0140026 A1 * | 10/2002 | Ishikawa et al. | 257/330 |
| 2002/0167046 A1 | 11/2002 | Aoki et al. | |
| 2004/0150038 A1 | 8/2004 | Hshieh et al. | |
| 2004/0209474 A1 * | 10/2004 | Tews et al. | 438/690 |
| 2006/0205222 A1 * | 9/2006 | In't Zandt et al. | 438/700 |
| 2008/0224149 A1 | 9/2008 | Yoshie | |
| 2010/0059816 A1 * | 3/2010 | Shimada et al. | 257/334 |

FOREIGN PATENT DOCUMENTS

| | | |
|---|---|---|
| JP | 08-088321 A | 4/1996 |
| JP | 2000-312003 A | 11/2000 |
| JP | 2003-188379 A | 7/2003 |
| JP | 2003-282870 A | 10/2003 |
| JP | 2004-055976 A | 2/2004 |
| JP | 2005-510087 T | 4/2005 |
| JP | 2007-165657 A | 6/2007 |
| JP | 2007-242943 A | 9/2007 |
| JP | 2009-081412 A | 4/2009 |
| WO | WO 01/41201 A1 | 6/2001 |
| WO | WO 03/015179 A2 | 2/2003 |

OTHER PUBLICATIONS

Form PCT/IPEA/408 for corresponding International Application No. PCT/JP2012/001791 dated Nov. 12, 2012.

Preliminary Report on Patentability for corresponding International Application No. PCT/JP2012/001791 dated Mar. 12, 2013.

* cited by examiner (a)

(b)

(c)

(a)

(b)

(c)

(a)

(b)

(c)

(a)

(b)

(a)

(b)

(c)

(a)

(b)

(c)

(a)

(b)

(c)

(a)

(b)

(a)

(b)

(c)

(a)

(b)

(a)

(b)

(c)

(a)

(b)

(c)

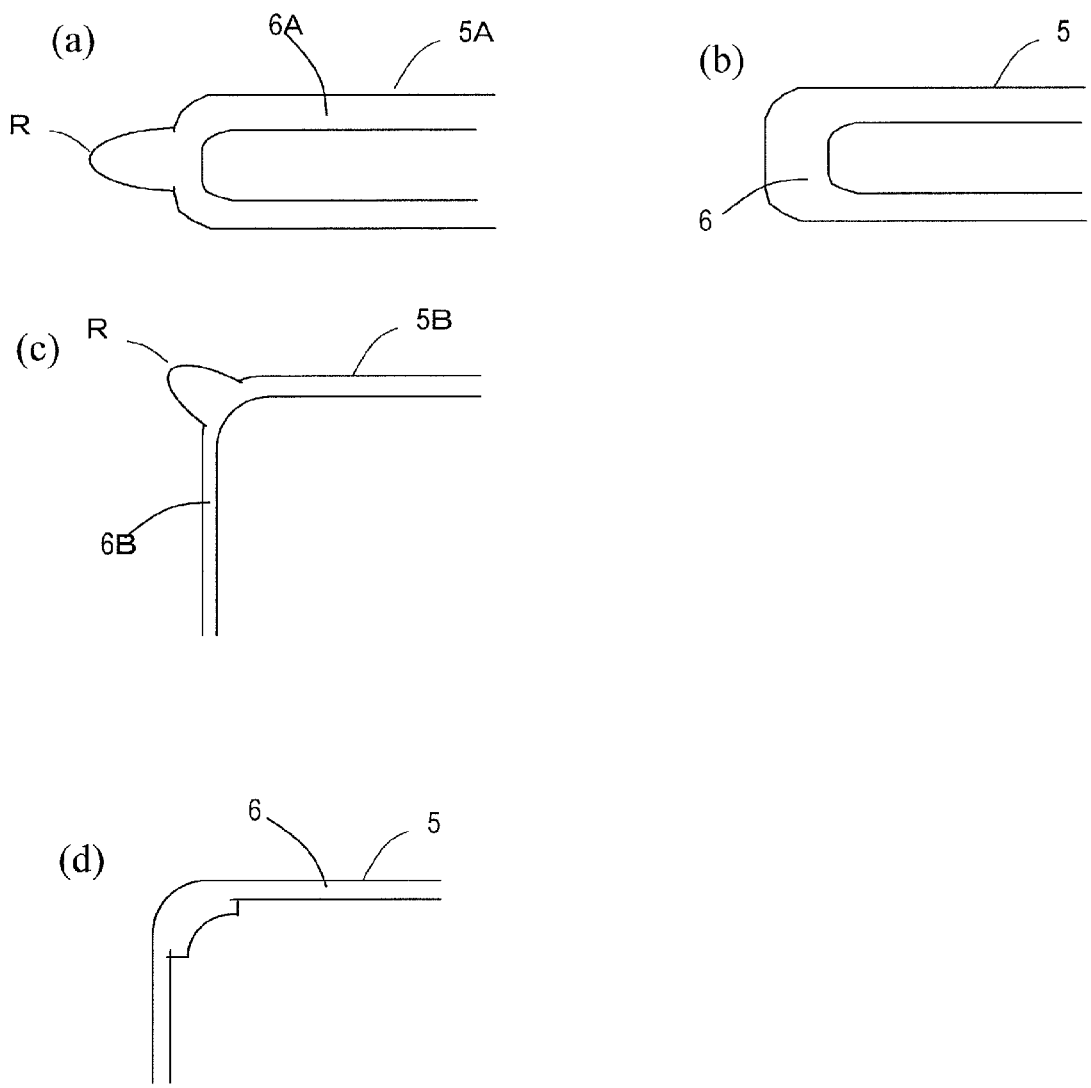

SEMICONDUCTOR DEVICE AND METHOD FOR PRODUCING SAME

TECHNICAL FIELD

The present application relates to an MIS (Metal Insulator Semiconductor) type semiconductor device having a trench gate structure using a wide band gap semiconductor, and a method for manufacturing the same.

BACKGROUND ART

Wide band gap semiconductors have been applied to various types of semiconductor devices, such as power elements (also referred to as "power devices"), environmental resistance elements, high-temperature operation elements, and high-frequency elements. Among others, applications to power devices, such as switching elements and rectifier elements, have been drawing public attention.

Typical switching elements of power devices include field effect transistors, such as metal-insulator-semiconductor field effect transistors (hereinafter, "MISFETs") and metal-semiconductor field effect transistors (hereinafter, "MESFETs"). Such a switching element can be switched, based on the voltage applied between the gate electrode and the source electrode, between an ON state where a drain current of some A (ampere) or more flows therethrough, and an OFF state where the drain current is zero. In the OFF state, a high peak inverse voltage of some hundreds of V or more is realized.

Among other wide band gap semiconductors, power devices using silicon carbide (SiC) (SiC power devices) have been actively developed because it is relatively easy to manufacture an SiC substrate and it is possible to form silicon oxide ($SiO_2$), which is a high-quality gate insulating film, through thermal oxidation of SiC.

Since SiC has a higher breakdown electric field and a higher thermal conductivity than Si, it is easy, with an SiC power device, to realize a higher peak inverse voltage and a lower loss as compared with an Si power device.

In order to conduct an even larger current through a power device such as a MISFET, it is effective to increase the channel density. Therefore, vertical power MISFETs of the trench gate structure have been proposed, replacing the conventional planar gate structure. The channel region is formed in the surface of the semiconductor layer in the planar gate structure, whereas the channel region is formed on the side surface of the trench formed in the semiconductor layer in the trench gate structure.

However, a problem with MISFETs of the trench gate structure is that the electric field intensity to be applied to the gate insulating film is very high.

To address the problem that the electric field intensity is high at the terminal portion of stripe-shaped trenches, Patent Document No. 1 proposes narrowing the width of the trench stepwise at the terminal portion and reducing the depth of the trench at the terminal portion in order to reduce the electric field intensity acting on the terminal portion.

On the other hand, Patent Document Nos. 2 and 3 propose making the gate insulating film thicker in a bottom portion of the trench to increase the breakdown electric field in order to prevent the dielectric breakdown due to the electric field concentration in the bottom portion of the trench. Patent Document No. 2 discloses selectively making the insulating film (thermal oxidation film) thicker in the trench bottom portion by using the (0001) carbon face whose oxidation rate is high as the trench bottom surface. Patent Document No. 3 proposes making the insulating film thicker by the thickness of the oxide film in the trench bottom portion by depositing an oxide film inside the trench and then etching the oxide film selectively so as to leave the trench bottom portion.

CITATION LIST

Patent Literature

Patent Document No. 1: Japanese Laid-Open Patent Publication No. 2003-188379
Patent Document No. 2: Japanese Laid-Open Patent Publication No. 7-326755
Patent Document No. 3: Japanese National Phase PCT Laid-Open Publication No. 2005-510087

SUMMARY OF INVENTION

Technical Problem

Studies by the present inventors have shown that it is difficult, by the methods proposed in Patent Document Nos. 1-3, to sufficiently ease the electric field concentration at the trench. The details of the study results will be described later.

The present invention has been made in view of the above, and it is an object thereof to provide a semiconductor device having a trench structure, wherein the electric field concentration occurring at the trench is reduced, thereby preventing dielectric breakdown.

Solution to Problem

In order to solve these problems, one aspect of the present invention includes a semiconductor device including: a substrate; a semiconductor layer of a wide band gap semiconductor arranged on a principal surface of the substrate; a trench arranged in the semiconductor layer and including a bottom surface, a plurality of main side surfaces, and a plurality of corner side surfaces each connecting together two adjacent main side surfaces; a gate insulating film arranged on the bottom surface, the main side surfaces and the corner side surfaces of the trench; and a gate electrode arranged in the trench and being insulated from the semiconductor layer by means of the gate insulating film, wherein: the semiconductor layer includes a drift region of a first conductivity type, and a body region of a second conductivity type arranged on the drift region; the trench runs through the body region and has the bottom surface inside the drift region; the corner side surfaces of the trench do not have a depressed portion; the gate insulating film is thicker on the corner side surfaces of the trench than on the main side surfaces of the trench; and a portion of the gate insulating film that is located on the corner side surfaces is a first insulating layer, and a portion of the gate insulating film that is located on the main side surfaces is a second insulating layer.

Advantageous Effects of Invention

According to an embodiment of the present invention, a thicker gate insulating film is arranged on the corner side surfaces located at corner portions of the trench, as compared with that on the main side surfaces, and it is therefore possible to reduce the electric field intensity occurring at the corner portions of the trench, thereby preventing dielectric breakdown.

According to a method for manufacturing a semiconductor device of one embodiment of the present invention, even if the trench is miniaturized, a thicker gate insulating film can be formed on the corner side surfaces of the trench, as compared with that on the main side surfaces, without complicating the manufacturing process.

BRIEF DESCRIPTION OF DRAWINGS

FIG. 43 (*a*) to (*d*) are plan views showing a trench and a gate insulating film, wherein (a) and (c) show a case where a depressed portion is provided at the corner side surface, and (b) and (d) show a case where a depressed portion is not provided at the corner side surface.

DESCRIPTION OF EMBODIMENTS

A cross-sectional structure of a vertical MISFET having a conventional trench gate structure will first be described with reference to the drawings. A vertical MISFET typically includes a plurality of unit cells arranged in two dimensions. Each unit cell is provided with a trench gate.

Figure 39:
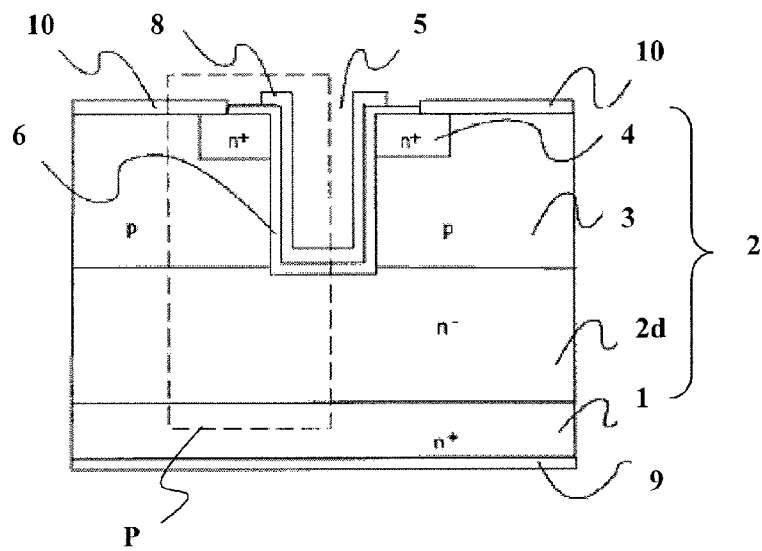
FIG. 39 A cross-sectional structure diagram showing one cell pitch of a trench-type MISFET (a MISFET having a trench gate on a side surface vertical to the principal surface; this definition applies hereinbelow) having a conventional common trench gate structure.

FIG. 39 is a cross-sectional view showing a one cell pitch (i.e., one unit cell) of a conventional vertical MISFET having a trench gate structure. An example is illustrated herein, where each unit cell is provided with a trench gate having a side surface generally vertical to the principal surface of the substrate.

The vertical MISFET shown in FIG. 39 includes a substrate 1 formed by silicon carbide, and a silicon carbide layer 2 formed on the principal surface of the substrate 1. The silicon carbide layer 2 includes a n-type drift region $2d$ formed on the principal surface of the substrate 1, and a p-type body region 3 formed on the drift region $2d$. An n-type source region 4 is arranged in a portion of the surface region of the body region 3. Formed in the silicon carbide layer 2 is a trench 5 running through the body region 3 to reach the drift region $2d$. In this example, the trench 5 has a side surface vertical to the principal surface of the substrate 1. Arranged in the trench 5 are a gate electrode 8, and a gate insulating film 6 for insulating the gate electrode 8 and the silicon carbide layer 2 from each other. A source electrode 10 is provided on the silicon carbide layer 2 so as to be in contact with the source region 4. A drain electrode 9 is provided on the reverse side of the substrate 1.

Such a vertical MISFET is manufactured as follows, for example.

First, on the principal surface of the low-resistance n-type substrate 1, the silicon carbide layer 2 having a similar crystalline structure to that of the substrate 1 is formed. For example, the n-type drift region $2d$ and the p-type body region 3 are formed by epitaxial growth in this order on the principal surface of the substrate 1, thereby obtaining the silicon carbide layer 2. Then, a mask layer (not shown) of a silicon oxide film is arranged over a predetermined area of the silicon carbide layer 2, and n-type impurity ion (e.g., N (nitrogen) ion) is injected into the body region 3 using the mask layer as a mask, thereby forming the source region 4 in the body region 3.

After removing the mask layer, an Al film (not shown) is formed over a portion of the source region 4 with an oxide film interposed therebetween, and the vertical trench 5 reaching the drift region $2d$ is formed using the Al film as a mask.

Then, the gate insulating film 6 and the gate electrode 8 are formed in the trench 5. The gate insulating film 6 is an oxide film formed through thermal oxidation of the silicon carbide layer 2, for example.

The gate electrode 8 is formed by depositing polysilicon on the gate insulating film 6 by LP-CVD (Low Pressure Chemical Vapor Deposition) method, for example, and then patterning the polysilicon. The source electrode 10 is formed on the silicon carbide layer 2 so as to bridge between the body region 3 and the source region 4, thereby forming the drain electrode 9 on the reverse side of the substrate 1. Thus, a vertical MISFET having a trench gate structure is completed.

In a MISFET having a trench gate structure, when the source electrode 10 is connected to the ground potential and the gate electrode 8 is connected to the ground potential or when the gate electrode 8 is negatively biased, the path for electrons, which are conduction carriers, is blocked between the source region 4 and the drift region $2d$ and no current flows therebetween (OFF state) because an accumulated state is reached where positive holes are induced in a region around the interface between the body region 3 and the gate insulating film 6. If a high voltage is applied between the drain electrode 9 and the source electrode 10 so that the drain electrode 9 side is the positive side, the PN junction between the body region 3 and the drift region $2d$ is reversely biased, and a depletion layer expands in the body region 3 and the drift region $2d$, maintaining a high voltage.

If a positive bias greater than or equal to the threshold is applied to the gate electrode 8, an inversion layer is formed between the source region 4 and the drift region $2d$ because an inverted state is reached where electrons are induced around the interface between the body region 3 and the gate insulating film 6. As a result, carriers flow through elements in the following order: the source electrode 10, the source region 4, an inversion layer (not shown) formed in the body region 3 to be in contact with the gate insulating film 6, the drift region $2d$, the substrate 1, and the drain electrode 9 (ON state).

In a vertical MISFET having a planar structure, a junction field effect transistor (hereinafter abbreviated as "JFET") is formed parasitically between adjacent unit cells, thus presenting a resistance component (JFET resistance). The JFET resistance is the resistance when a current flows through the drift region $2d$ sandwiched between adjacent body regions 3, and increases as the gap between unit cells (the gap between adjacent body regions 3) narrows. Therefore, if the cell pitch is reduced for miniaturization, the JFET resistance increases, thereby increasing the ON resistance.

In contrast, an advantage of a MISFET having a trench gate structure is that since there is no JFET resistance, the ON resistance monotonously decreases as the cell pitch is reduced. This is advantageous for the miniaturization of the size of the unit cells.

However, a MISFET of a trench gate structure has a problem that the electric field intensity to be applied to the gate insulating film 6 is very high, which may cause dielectric breakdown.

The present inventors have studied the cause of dielectric breakdown occurring in semiconductor devices having a trench structure. As a result, it has been found that the electric field intensity applied to the gate insulating film 6 is higher at corner portions of a trench as a MISFET is seen from above.

In the present specification, the term "seen from above" refers to being seen from a direction vertical to the principal surface of the substrate. The term "corner portion" refers to an apex portion of a polygonal shape in a case where the MISFET is formed by polygonal (e.g., rectangular) unit cells with a polygonal trench arranged for each unit cell as the MISFET is seen from above. Each apex portion may be rounded. In the present specification, the term "corner side surface" is used to refer to those of a plurality of side surfaces defining the trench that are located at the corner portions, and the term "main side surface" is used to refer to the other side surfaces, which include an area to be the channel. Therefore, a trench whose planar shape is a n-gon, for example, includes n main side surfaces, and n corner side surfaces each connecting two adjacent main side surfaces together.

Figure 40:
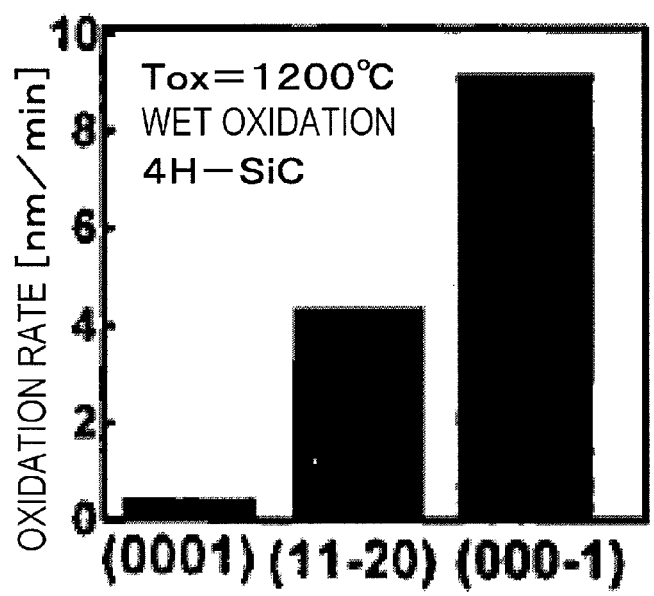
FIG. 40 A graph showing the surface orientation dependence of the oxidation rate of silicon carbide.

The electric field intensity is high at a corner portion of a trench as the MISFET is seen from above (hereinafter referred to simply as a "corner portion of the trench") for the following reason.

Where a thermal oxidation film, which is obtained by oxidizing the surface of a silicon carbide layer, is formed as the gate insulating film, the growth rate (oxidation rate) of the thermal oxidation film varies depending on the crystal plane orientation of silicon carbide. FIG. 40 is a graph showing the surface orientation dependence of the oxidation rate when oxidizing silicon carbide (wet oxidation). Herein, the oxidation rate at a temperature of 1200° C. is shown for the (0001) plane, the (11-20) plane and the (000-1) plane of 4H—SiC. It can be seen from this graph that the oxidation rate of silicon carbide varies significantly depending on the surface orientation. Since various surface orientations appear along a corner side surface of a trench, as compared along a main side surface, when a gate insulating film is formed through thermal oxidation, there may be a portion where the gate insulating film is thin due to surface orientations for which the oxidation rate is low. A large electric field intensity may act on this portion where the gate insulating film is thin, which may cause dielectric breakdown.

With such conventional techniques as proposed in Patent Document Nos. 1-3, for example, it is difficult to sufficiently ease the electric field concentration at a corner portion of the trench.

In order to form a trench configured as proposed in Patent Document No. 1, the terminal portion of the trench needs to be narrowed stepwise by varying mask dimensions in the lithography step. It is difficult to apply this configuration to a corner portion of the trench having a rectangular or polygonal planar shape. According to the method of Patent Document No. 1, as cells are further miniaturized, the resolution of the dimension less than or equal to the trench width decreases, making it impossible to form a predetermined pattern (a pattern that is narrowed stepwise in the terminal portion). Moreover, in a semiconductor device using silicon carbide, it is not possible to solve the problem that the gate insulating film becomes thin in the terminal portion of the trench due to the surface orientation dependence of the oxidation rate of silicon carbide, resulting in an electric field intensity acting thereon.

On the other hand, the methods proposed in Patent Document Nos. 2 and 3 aim at preventing dielectric breakdown due to electric field concentration occurring in a bottom portion of the trench, and is not directed to easing electric field concentration at a corner portion of the trench.

Note that while a silicon carbide MISFET has been described above as an example, semiconductor devices using other wide band gap semiconductors (GaN, AlN, diamond, etc.) other than silicon carbide have similar problems.

In view of this, based on the above findings, the present inventors newly researched on a semiconductor device having a trench structure, wherein electric field concentration occurring at a corner portion of the trench is eased to thereby prevent dielectric breakdown, thus arriving at the present invention.

That is, one aspect of the present invention includes a semiconductor device including: a substrate; a semiconductor layer of a wide band gap semiconductor arranged on a principal surface of the substrate; a trench arranged in the semiconductor layer and including a bottom surface, a plurality of main side surfaces, and a plurality of corner side surfaces each connecting together two adjacent main side surfaces; a gate insulating film arranged on the bottom surface, the main side surfaces and the corner side surfaces of the trench; and a gate electrode arranged in the trench and being insulated from the semiconductor layer by means of the gate insulating film, wherein: the semiconductor layer includes a drift region of a first conductivity type, and a body region of a second conductivity type arranged on the drift region; the trench runs through the body region and has the bottom surface inside the drift region; the corner side surfaces of the trench do not have a depressed portion; the gate insulating film is thicker on the corner side surfaces of the trench than on the main side surfaces of the trench; and a portion of the gate insulating film that is located on the corner side surfaces is a first insulating layer, and a portion of the gate insulating film that is located on the main side surfaces is a second insulating layer.

The trench may have a polygonal shape as seen from a direction vertical to the principal surface of the substrate, and the corner side surfaces are located at respective apexes of the polygonal shape.

The first insulating layer may be a deposited film, and the second insulating layer may be a thermal oxidation film.

The gate insulating film may be thicker on the bottom surface of the trench than on the main side surfaces of the trench.

A surface of a portion of the gate insulating film that is located on the corner side surfaces may be more inside of the trench than a surface of a portion thereof that is located on the main side surfaces.

The trench may have a stripe shape as seen from a direction vertical to the principal surface of the substrate, and the corner side surfaces may be located at terminal portions of the stripe shape.

A thickness Tc of the gate insulating film on the corner side surfaces may be 1.5 times or more a thickness Ts thereof on the main side surfaces.

A thickness Tb of the gate insulating film on the bottom surface may be 3 times or more a thickness Ts thereof on the main side surfaces.

A carbon concentration of the first insulating layer may be lower than a carbon concentration of the second insulating layer.

One aspect of the present invention includes a method for manufacturing a semiconductor device, the method including the steps of: (a) providing a substrate including a semiconductor layer of a wide band gap semiconductor formed on a principal surface thereof, the semiconductor layer including a drift region of a first conductivity type, and a body region of a second conductivity type arranged on the drift region; (b) forming a trench on the semiconductor layer, the trench including a bottom surface, a plurality of main side surfaces, and a plurality of corner side surfaces each connecting together two adjacent main side surfaces, wherein the trench runs through the body region and has the bottom surface inside the drift region; (c) forming a first insulating layer on the corner side surfaces of the trench, wherein the first insulating layer is not formed on the main side surfaces of the trench; (d) forming a second insulating layer thinner than the first insulating layer in the trench by oxidizing the wide band gap semiconductor on the main side surfaces of the trench, thereby obtaining a gate insulating film including the first insulating layer and the second insulating layer, the gate insulating film being thicker on the corner side surfaces of the trench than on the main side surfaces; and (e) forming a gate electrode to be in contact with the gate insulating film in the trench.

In the step (c), the first insulating layer may be formed by depositing an insulating material on the corner side surfaces.

The step (c) may include the steps of: (c1) forming an insulating film on the main side surfaces, the corner side surfaces and the bottom surface of the trench; (c2) forming a third mask on the insulating film, wherein the third mask covers corner portions of the trench while exposing portions thereof other than the corner portions, as seen from a direction vertical to a principal surface of the substrate; and (c3) forming the first insulating layer by etching the insulating film using the third mask as an etching mask.

In the step (c1), the insulating film may be formed so that an inside of the trench is filled by the insulating film.

In the step (c3), the insulating film may be etched so that a portion of the insulating film is left unremoved in a bottom portion of the trench, thereby forming the first insulating layer on the corner side surfaces and the bottom surface of the trench.

The method may further include a step of performing a heat treatment between the step (c1) and the step (c2), wherein the insulating film is an impurity-doped oxide film.

The step (c2) may include the steps of: (c21) forming a mask material film on the insulating film; (c22) forming a fourth mask on the mask material film, wherein the fourth mask covers corner portions of the trench while exposing portions thereof other than the corner portions, as seen from a direction vertical to a principal surface of the substrate; and (c23) forming the third mask by etching the mask material film so that a portion of the mask material film is left unremoved in a bottom portion of the trench using the fourth mask as an etching mask, wherein in the step (c3), the first insulating layer is formed on the corner side surfaces and the bottom surface of the trench.

First Embodiment

A semiconductor device according to a first embodiment of the present invention will now be described with reference to the drawings. A semiconductor device of the present embodiment is a trench-type vertical MISFET using silicon carbide, and has a configuration with an array of a plurality of unit cells. Note that the present embodiment is not limited to a silicon carbide MISFET, but is applicable to other silicon carbide semiconductor devices, such as silicon carbide MESFETs, and semiconductor devices using wide band gap semiconductors other than silicon carbide.

The semiconductor device of the present embodiment includes a plurality of unit cells arranged in two dimensions. Unit cells having a polygonal, e.g., rectangular, planar shape may be arranged in the x direction and in the y direction vertical to the x direction, or stripe-shaped unit cells may be arranged in one direction.

Figure 1:
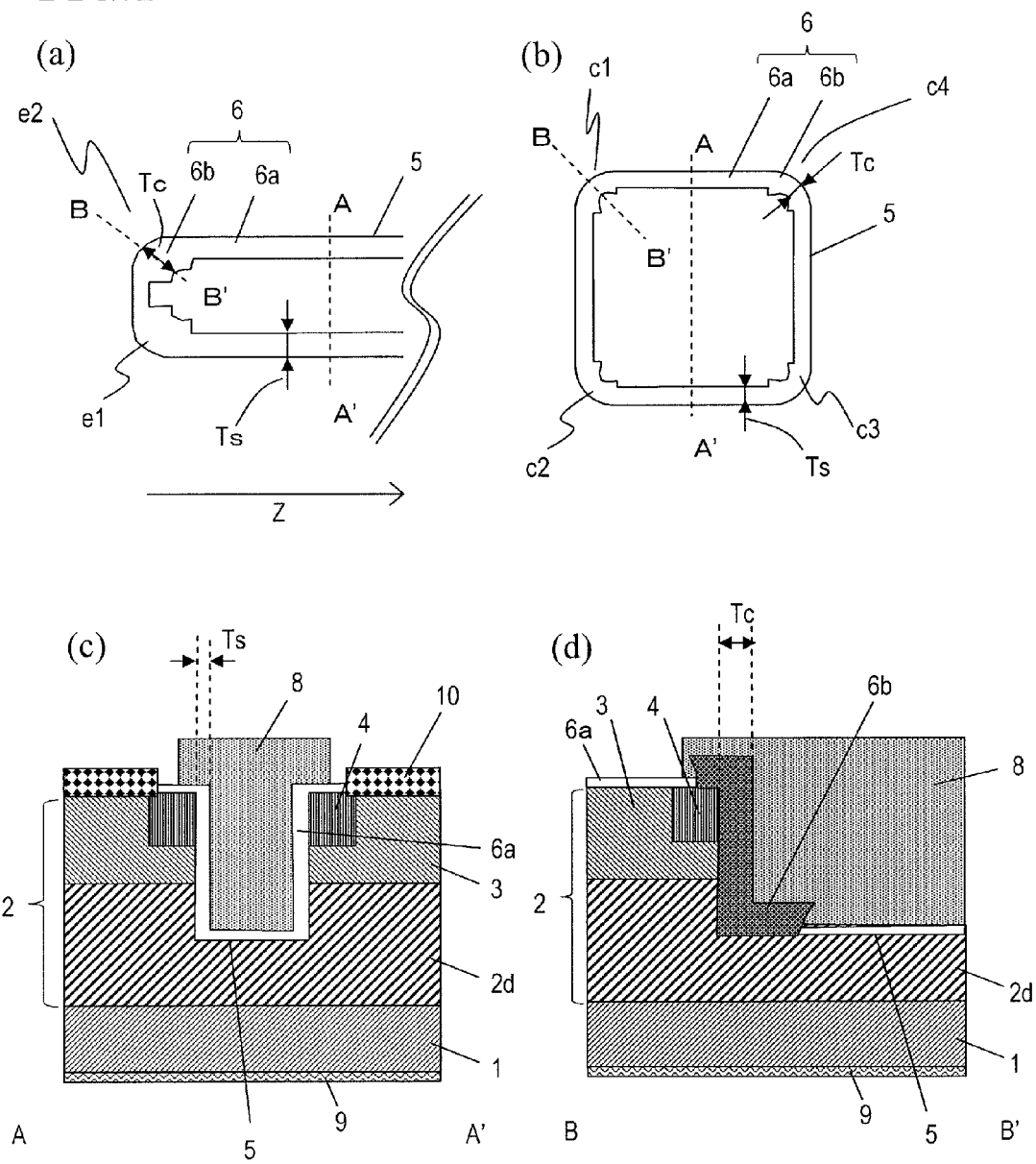
FIGS. 1 (a) and (b) are plan views showing a trench in a semiconductor device according to a first embodiment of the present invention, (c) and (d) are cross-sectional views showing the semiconductor device of the first embodiment.
Figure 2:
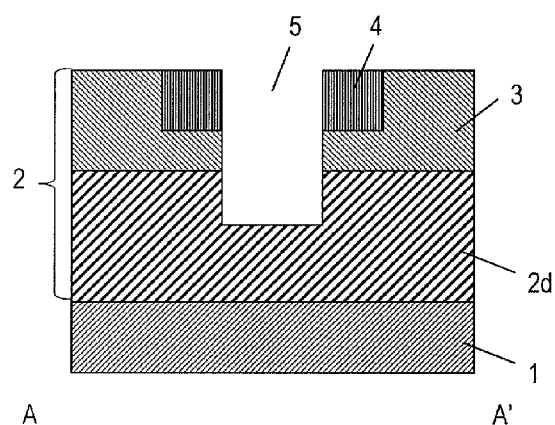
FIG. 2 (a) to (c) are diagrams each illustrating a method for manufacturing a semiconductor device of the first embodiment, wherein (a) and (b) are process cross-sectional views, and (c) is a plan view showing the trench.
Figure 2:
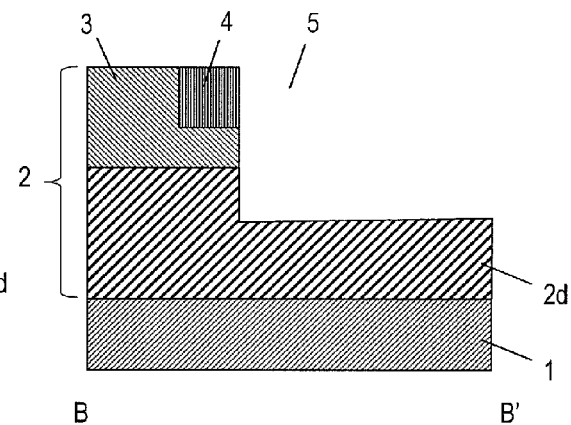
Figure 2:
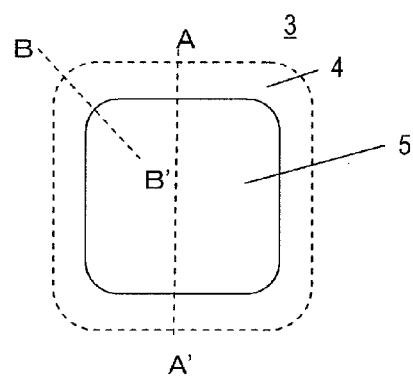
Figure 3:
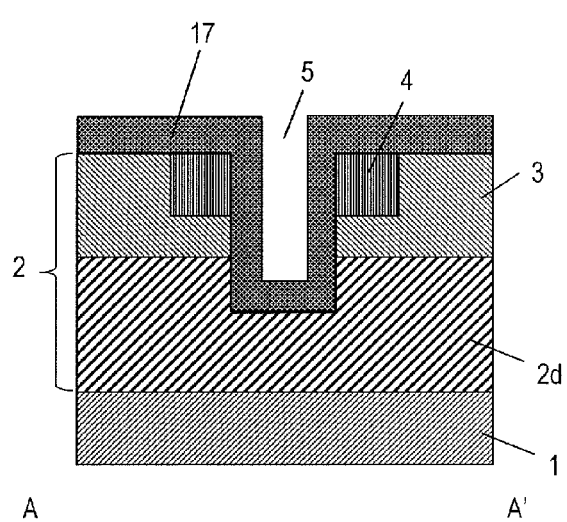
FIG. 3 (a) to (c) are diagrams each illustrating a method for manufacturing a semiconductor device of the first embodiment, wherein (a) and (b) are process cross-sectional views, and (c) is a plan view showing the trench.
Figure 3:
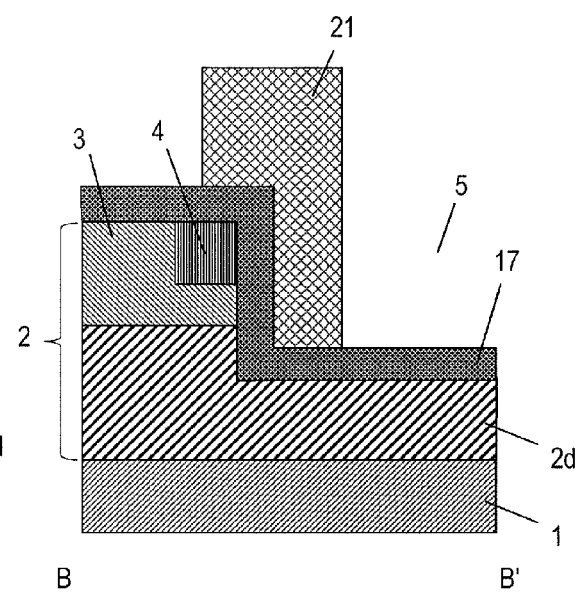
Figure 3:
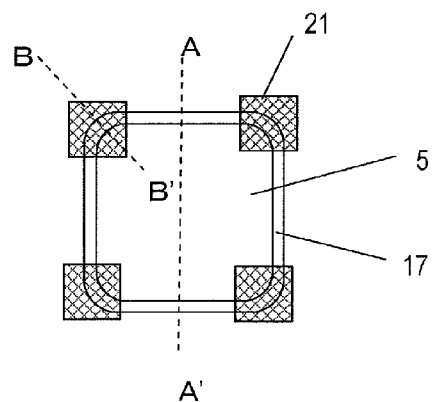
Figure 4:
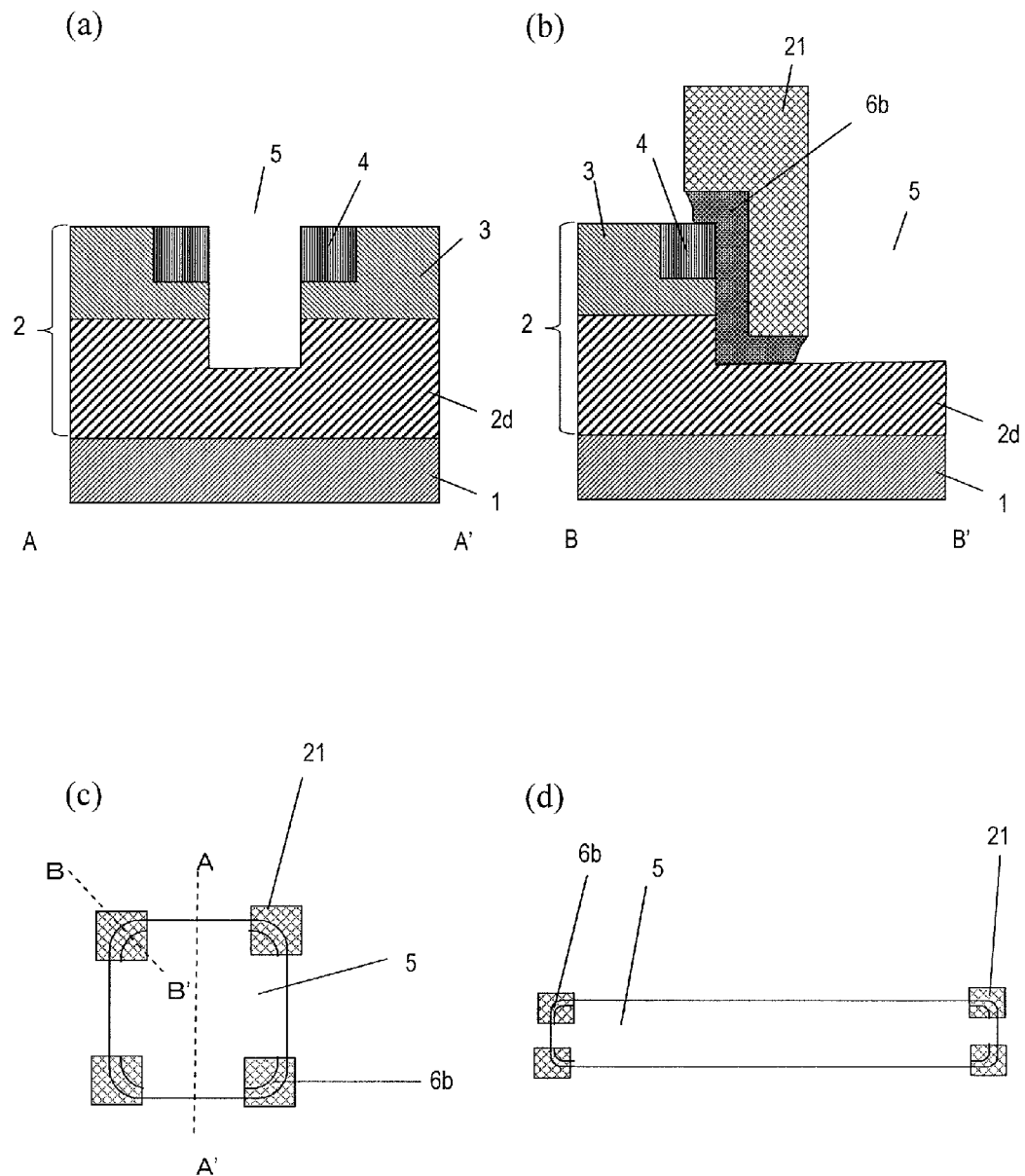
FIG. 4 (a) to (d) are diagrams each illustrating a method for manufacturing a semiconductor device of the first embodiment, wherein (a) and (b) are process cross-sectional views, and (c) and (d) are plan views showing the trench.
Figure 5:
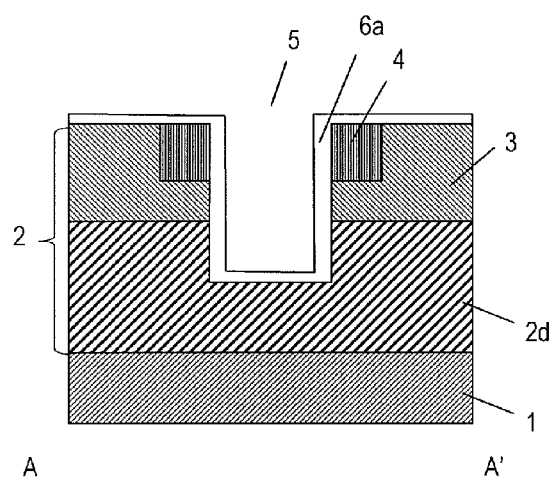
FIG. 5 (a) to (c) are diagrams each illustrating a method for manufacturing a semiconductor device of the first embodiment, wherein (a) and (b) are process cross-sectional views, and (c) is a plan view showing the trench.
Figure 5:
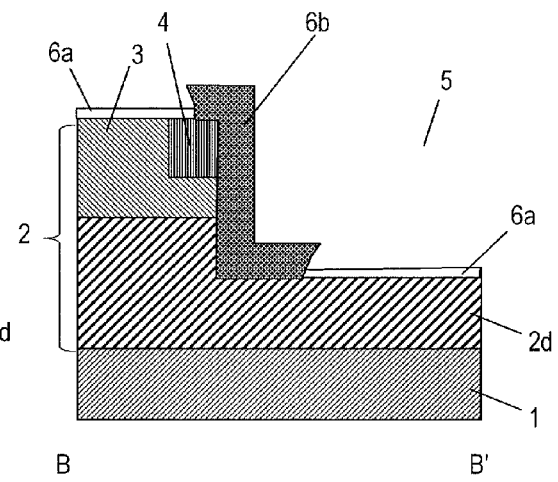
Figure 5:
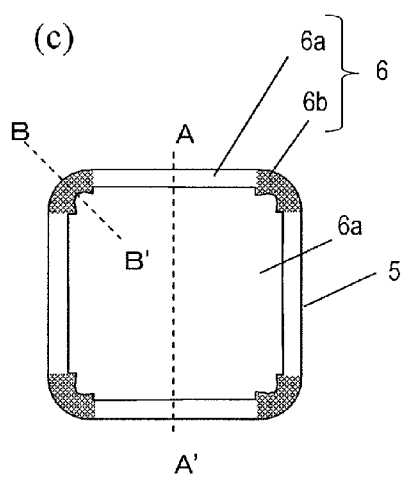
Figure 6:
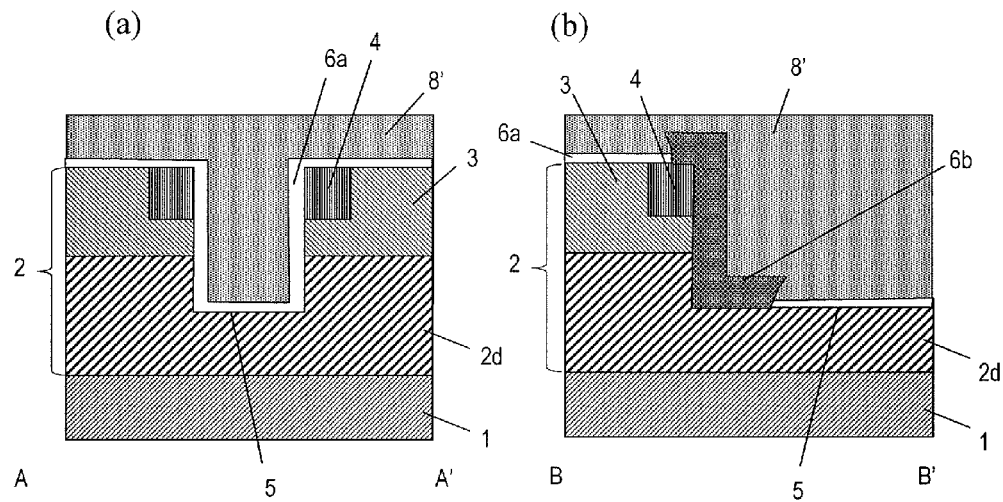
FIGS. 6 (a) and (b) are process cross-sectional views each illustrating a method for manufacturing a semiconductor device of the first embodiment.
Figure 7:
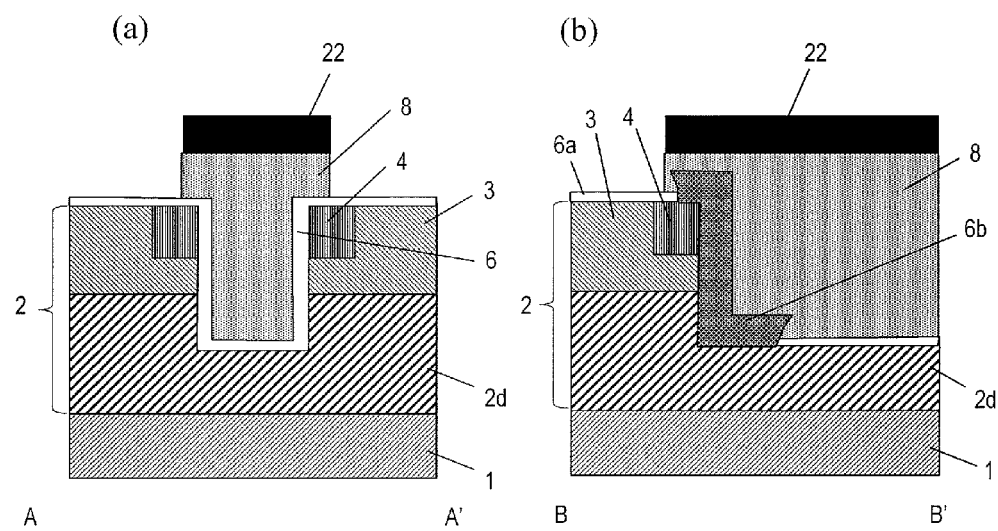
FIGS. 7 (a) and (b) are process cross-sectional views each illustrating a method for manufacturing a semiconductor device of the first embodiment.
Figure 8:
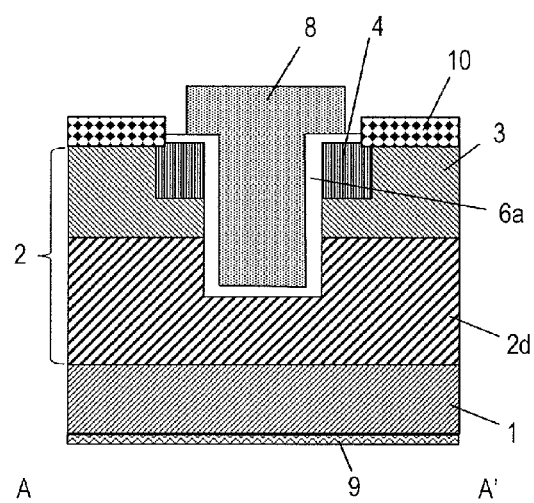
FIGS. 8 (a) and (b) are process cross-sectional views each illustrating a method for manufacturing a semiconductor device of the first embodiment.
Figure 8:
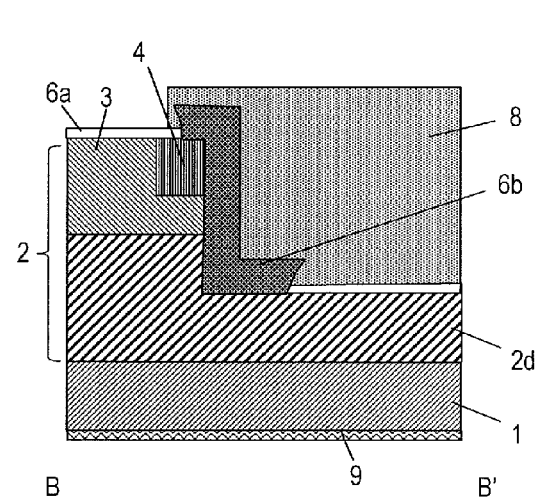

FIGS. 1(a) and 1(b) are diagrams showing a trench and a gate insulating film arranged in a unit cell of a semiconductor device of the present embodiment, as seen from above. FIGS. 1(a) and 1(b) illustrate the planar shape of the trench 5 and the gate insulating film 6 arranged in a stripe-shaped unit cell (hereinafter referred to as a "stripe-shaped cell") and a rectangular unit cell (hereinafter referred to as a "rectangular cell"), respectively. In these figures, elements other than the trench 5 and the gate insulating film 6 are omitted in order to more clearly show the shape of the trench 5 and the gate insulating film 6.

FIGS. 1(c) and 1(d) are cross-sectional views showing a unit cell of the semiconductor device of the present embodiment. FIG. 1(c) is a cross-sectional view taken along line A-A' of FIGS. 1(a) and 1(b), and FIG. 1(d) is a cross-sectional view taken along line B-B' of FIGS. 1(a) and 1(b).

A unit cell of the semiconductor device includes the substrate 1 including silicon carbide, and the silicon carbide layer 2 arranged on the surface (principal surface) of the substrate 1 and formed by silicon carbide. The silicon carbide layer 2 includes the drift region 2d of the first conductivity type (herein, n type) formed on the principal surface of the substrate 1, and the body region 3 of the second conductivity type (herein, p type) formed on the drift region 2d. The source region 4 of the first conductivity type (n type) is arranged in a portion of the surface region of the body region 3. In the illustrated example, the source region 4 is surrounded by the body region 3.

The silicon carbide layer 2 includes the trench 5 running through the source region 4 and the body region 3 to reach the drift region 2d. The gate insulating film 6 is arranged on the bottom surface and the side surface of the trench 5. The gate insulating film 6 is in contact with the gate electrode 8 at least on the side surface of the trench 5. A conductive layer serving as the gate electrode 8 is arranged in the trench 5. The gate electrode 8 and the silicon carbide layer 2 are insulated from each other by the gate insulating film 6. Herein, the gate insulating film 6 is an oxide film obtained by subjecting silicon carbide to a heat treatment, for example.

The trench 5 is defined by the bottom surface, plurality of main side surfaces, and a plurality of corner side surfaces. As described above, a corner side surface is a side surface located at a corner portion of the trench 5 and couples together two adjacent main side surfaces.

With a stripe-shaped cell, the trench 5 extends in the z direction from one end (terminal portion) toward the other end (not shown) as seen from the direction vertical to the principal surface of the substrate 1, as shown in FIG. 1(a). The gate insulating film 6 arranged in the trench 5 is thicker on side surfaces at corner portions e1 and e2 at a terminal portion of the trench 5 than on side surfaces of the trench 5 other than those at corner portions (main side surfaces (e.g., a side surface extending in the longitudinal direction of the trench 5)). Note that the side surface extending in the longitudinal direction of the trench 5 is (11-20) plane, for example. When the (11-20) plane is used as a channel, the electron mobility can be further increased.

With a rectangular cell, the trench 5 is rectangular as seen from the direction vertical to the principal surface of the substrate 1, as shown in FIG. 1(b). As shown in the figures, corner portions c1 to c4 of the rectangular shape may be rounded. The gate insulating film 6 arranged in the trench 5 is thicker on side surfaces (corner side surfaces) located at the corner portions c1 to c4 of the trench 5 than on main side surfaces.

The gate insulating film 6 of the present embodiment includes an insulating layer (first insulating layer) 6b formed through deposition on the side surface of the trench 5, and an insulating layer (second insulating layer) 6a formed through by oxidizing a surface portion (silicon carbide) of the trench 5. In the illustrated example, the insulating layer 6b is arranged on the corner side surface of the trench 5, and the insulating layer 6a is arranged on the main side surface and the bottom surface of the trench 5. The thickness (Tc) of the insulating layer 6b is larger than the thickness (Ts) of the insulating layer 6a.

An oxide film, a nitride film, or the like, may be used as the insulating layer 6b. Note that where a nitride film is used as the insulating layer 6b, the insulating layer 6a and the insulating layer 6b can be distinguished from each other depending on the nitrogen content. Where the insulating layer 6a is an oxide film (thermal oxidation film) formed by oxidizing silicon carbide and the insulating layer 6b is an oxide film (deposited film) formed by depositing an insulating material, they can be distinguished from each other based on differences in property between a deposited film and a thermal oxidation film. For example, a deposited film has a lower film density and a higher wet etching rate than a thermal oxidation film. Since a thermal oxidation film contains carbon, which has been included in silicon carbide, a thermal oxidation film has a higher carbon concentration than a deposited film.

The semiconductor device also includes the source electrode 10 provided on the silicon carbide layer 2, and the drain electrode 9 formed on the reverse side of the substrate 1. The source electrode 10 is electrically connected to the source region 4 and the body region 3. An interlayer insulating film (not shown) is formed on the source electrode 10 and the gate electrode 8. A source line (not shown) is provided on the interlayer insulating film. The source line is electrically connected to the source electrode 10 through a contact hole formed in the interlayer insulating film.

The present embodiment provides the following advantages.

As described above, with conventional semiconductor devices, the thickness of the gate insulating film 6 is likely to be smaller on portions of the side surface of the trench 5 that are located at the corner portions c1 to c4, e1 and e2, due to the surface orientation dependence of the oxidation rate when forming the gate insulating film 6. Thus, the threshold voltage lowers, and a current may possibly flow when the semiconductor device is OFF. Moreover, electric field concentration may occur at a portion where the gate insulating film 6 is thin, thereby causing dielectric breakdown.

In contrast, according to the present embodiment, since the thickness Tc of a portion of the gate insulating film 6 that is located on the corner side surface of the trench 5 is larger than the thickness Ts of another portion thereof that is located on the main side surface, it is possible to prevent the decrease in the threshold voltage or the electric field concentration due to the gate insulating film 6 being thinner than the design value. The thickness difference Tc-Ts in the present embodiment is larger than the thickness difference defined by the surface orientation dependence of the oxidation rate.

Where the insulating layer 6b of the present embodiment is formed as a deposited film, the following advantages are realized as compared with a case where it is formed as a thermal oxidation film.

When one attempts to form the insulating layer 6b as a thermal oxidation film, it is difficult to form a sufficiently thick thermal oxidation film. Note that although it is possible to form a thicker thermal oxidation film by injecting impurity ion into the side wall of the trench, the formation of a thick thermal oxidation film may cause a large stress on the silicon carbide layer, resulting in a crystal defect of silicon carbide. When injecting impurity ion into the side wall of the trench (diagonal injection), impurity ion or crystal defects may inevitably exist in portions of the silicon carbide layer that are not thermally oxidized, thereby causing a leak. Moreover, when one attempts to make only the corner portions of the thermal oxidation film thicker, a region where the thickness changes gradually (e.g., the thickness Tx, V1<Tx<T2) is formed between a thick portion (e.g., the thickness T2) on the corner side surface and a thin portion (e.g., the thickness T1) on the main side surface. Therefore, the thickness of the thermal oxidation film located on the channel becomes non-uniform, and it may be difficult to control the device to achieve desirable transistor characteristics.

In contrast, when the insulating layer 6b is formed as a deposited film, the insulating layer 6b of an intended thickness can be formed, whereby it is possible to control the transistor characteristics based on the thickness of the insulating layer 6a while making the insulating layer 6b sufficiently thick, thus effectively preventing dielectric breakdown. It is also possible to prevent the stress caused when forming a thermal oxidation film or the crystal defect caused by the ion implantation. Moreover, since it is possible to more accurately control the thickness of the gate insulating film 6 on the corner side surfaces and on the main side surfaces, it is possible to prevent dielectric breakdown while ensuring desirable transistor characteristics.

While the thickness Tc of the gate insulating film 6 on the corner side surfaces of the trench 5 is greater than the thickness Ts in the depth direction of the corner side surfaces of the trench 5 in the illustrated example, the configuration of the present embodiment is not limited to this. In the present embodiment, the advantageous effects described above can be realized if the gate insulating film 6 is thicker at least in-portions located on the body region 3 exposed on the corner side surfaces of the trench 5 than in portions located on the body region 3 exposed on the main side surfaces of the trench 5. Therefore, there may be a predetermined distribution between the thickness of the gate insulating film 6 on the corner side surfaces of the trench 5 and that on the main side surfaces thereof.

In the present specification, the thickness Ts refers to the thickness of the gate insulating film 6 located on the body region 3 exposed on the main side surface of the trench 5. Since the surface portion of the body region 3 exposed on the main side surface of the trench 5 primarily serves as the channel, this surface portion will be referred to as the "channel region". Therefore, the thickness Ts refers to the thickness of the gate insulating film 6 located on the channel region. Note that where a channel layer is arranged between the side surface of the trench 5 and the gate insulating film 6 (an accumulation channel structure), a portion of the channel layer that is in contact with the surface of the body region 3 exposed on the main side surface of the trench 5 serves as the "channel region".

Therefore, for example, the thickness of the gate insulating film 6 on the source region or the drift region 2d along the corner side surfaces of the trench 5 may be less than or equal to the thickness Ts on the channel region. Although the gate insulating film 6 is made thicker also on portions of the bottom surface of the trench 5 that is located at the corner portions in the illustrated example, it may not be made thicker on the bottom surface. Alternatively, the gate insulating film 6 may be formed thicker also in the bottom portion of the trench 5, as in an embodiment to be described below, so as to ease the electric field concentration occurring in the bottom portion of the trench 5.

While the configuration of the semiconductor device of the present embodiment has been described above using an example of an n-channel-type MISFET, the semiconductor device may be a p-channel-type MISFET. With a p-channel-type MISFET, the conductivity type of the substrate 1, the drift region 2d and the source region 4 is p type, while that of the body region 3 is n type.

Manufacturing Method of First Embodiment

Next, referring to the drawings, an example of a method for manufacturing a semiconductor device of the present embodiment will be described.

FIGS. 2 to 8 are diagrams each illustrating a method for manufacturing a semiconductor device of the present embodiment. In each figure, (a) and (b) are cross-sectional views taken along line A-A' and line B-B', respectively, of FIGS. 1(a) and 1(b), and (c) is a plan view of the trench 5. In the present embodiment and embodiments to follow, a portion of the plan view of the trench 5 formed by stripe-shaped cells is omitted.

First, as shown in FIGS. 2(a) to 2(c), the silicon carbide layer 2 including the drift region 2d of the first conductivity type (herein, n type) and the body region 3 of the second conductivity type (herein, p type) is obtained on the principal surface of the substrate 1, as in a conventional process. Then, the source region 4 is formed in the body region 3. After an annealing treatment is performed to activate the source region 4, the trench 5 is formed in the silicon carbide layer 2.

A low-resistance n-type SiC substrate containing nitrogen at a concentration of $3 \times 10^{18}$ cm$^{-3}$, for example, may be used as the substrate 1. Note that the silicon surface ((0001) plane), for example, is used as the principal surface of the substrate 1. With the silicon surface, as compared with the carbon surface ((000-1) plane), it is easier to control the epitaxial growth (the concentration and the thickness), and it is therefore possible to obtain an epitaxial layer with fewer defects.

The drift region 2d is doped with nitrogen at a concentration of $8 \times 10^{15}$ cm$^{-3}$, for example. The thickness of the drift region 2d is 12 μm, for example. Note that the thickness and the concentration of the drift region 2d are determined by the desired peak inverse voltage, and are not limited to the thickness and the concentration illustrated above.

The body region 3 is doped with aluminum at a concentration of $2 \times 10^{18}$ cm$^{-3}$, for example. The thickness of the body region 3 is 1 μm, for example.

Note that while the body region 3 is herein formed through epitaxial growth, it may alternatively be formed through ion implantation. Specifically, the body region 3 may be formed by forming the n-type silicon carbide layer 2 through epitaxial growth, and then implanting the surface region thereof with p-type impurity ion. In such a case, a region of the silicon carbide layer 2 into which no p-type impurity has been injected is the drift region 2d.

The source region 4 is formed through ion implantation, for example. First, a mask layer (not shown) of a silicon oxide film, for example, is arranged on a predetermined area of the silicon carbide layer 2. Then, n-type impurity ion (e.g., nitrogen ion) is injected into a portion of the body region 3 where a source region is to be formed, using a mask layer as an implantation mask. Herein, the acceleration energy is set to 100 keV, and the dose to $5 \times 10^{15}$ cm$^{-2}$. After removing the mask layer, an annealing treatment at a temperature of 1700° C. is performed for about 30 minutes in an inert gas atmosphere. This activates the injected impurity ion, thereby obtaining the source region 4.

The trench 5 is formed in the silicon carbide layer 2 so as to run through the source region 4 and the body region 3 and so as to have its bottom surface in the drift region 2d. Herein, the trench 5 is formed, which is rectangular as seen from a direction vertical to the principal surface of the substrate 1. First, an Al film (not shown) is formed on a portion of the source region 4 with an oxide film, for example, therebetween. Then, using the Al film as a mask, the trench (depth: 1.5 μm, for example, width: 1 μm, for example) 5 is formed in the silicon carbide layer 2 through reactive ion etching (RTE). While the side surface of the trench 5 is generally vertical to the principal surface of the substrate 1 in the illustrated example, the trench 5 may have a side surface inclined with respect to the direction normal to the principal surface of the substrate 1 (tapered shape). In the illustrated example, the bottom surface of the trench 5 is parallel to the principal surface of the substrate 1. Therefore, the surface orientation of the bottom surface of the trench 5 is the same as that of the principal surface (e.g., the silicon surface) of the substrate 1.

Then, as shown in FIGS. 3(a) to 3(c), an insulating film 17 is formed on the main side surfaces, the corner side surfaces and the bottom surface of the trench 5. Herein, as the insulating film 17, an oxide film (thickness: about 100 nm, for example) is formed inside the trench 5 (the side surface and the bottom surface) and on the surface of the silicon carbide layer 2 by an LP-CVD method, for example.

Then, a resist film is formed on the insulating film 17, and portions of the resist film are removed while leaving other portions that are located on the corner portions of the trench 5. Thus, a resist mask (referred to also as the first mask) 21 is obtained, which covers the corner portions of the trench 5 and exposes portions other than the corner portions. Note that as the insulating film 17, another insulating film, such as a nitride film, may be used instead of an oxide film. Note however that since an oxide film has a smaller dielectric constant than a nitride film, it is advantageous to use an oxide film because the electric field intensity can be made smaller, for the same thickness. The method for forming the insulating film 17 is not limited to the LP-CVD method, but may be another method such as a plasma CVD method. Note however that with an LP-CVD method, it is possible to form the insulating film 17 with a better coverage (a higher coverage for the side surface of the trench 5) than with other methods, the thickness of the insulating film 17 on the side surface of the trench 5 can be controlled with a higher precision.

Note that although not shown in the figures, when stripe-shaped cells are used, the insulating film 17 is formed on the main side surfaces, the corner side surfaces and the bottom surface of the trench 5, and the resist mask 21 is formed on the insulating film 17 so as to cover corner portions of the trench 5.

Then, as shown in FIGS. 4(a) to 4(c), using the resist mask 21 as an etching mask, the insulating film 17 is etched. Herein, the insulating film 17 is etched by a wet etching method using an HF-based solution, for example. This removes portions of the insulating film 17 that are exposed through the resist mask 21. Portions covered by the resist mask 21 are left unremoved and become the insulating layer 6b. Thus, the insulating layer 6b is obtained on the corner side surfaces of the trench 5. Dry etching using, for example, a CHF$_3$ gas, or the like, may be performed instead of wet etching. Use of wet etching prevents the introduction of crystal defects due to etching into the surface of the substrate 1.

Note that where stripe-shaped cells are used, the insulating layer 6b is formed on side surfaces (corner side surfaces) located in the terminal portion of the trench 5 as shown in FIG. 4(d). Note that while the resist masks 21 covering two corner portions located at each terminal portion of the cell are separated from each other in the illustrated example, they may alternatively be connected to each other.

After removing the resist mask 21, the insulating layer 6a is formed in portions of the side surface and the bottom surface of the trench 5 that are not covered by the insulating layer 6b, as shown in FIGS. 5(a) to 5(c). Herein, a heat treatment is performed in a dry oxidation atmosphere at a temperature of 1200° C. for three hours, for example, thereby oxidizing silicon carbide on the surface of the trench 5, thus obtaining the insulating film (thickness: 70 nm, for example) 6a. Thus, the gate insulating film 6 is obtained, which includes the insulating layers 6a and 6b. The thickness of the insulating layer 6a on the channel region is designed in accordance with the characteristics of the semiconductor device. On the other hand, the thickness of the insulating layer 6b is designed in view of preventing dielectric breakdown, and is larger than the thickness of the insulating layer 6a. Note that the thickness of the insulating layer 6a formed by a heat treatment may vary due to the surface orientation dependence of the oxidation rate of silicon carbide.

Thereafter, as shown in FIGS. 6(a) and 6(b), an electrode material (e.g., doped polysilicon) to be the gate electrode is deposited in the trench 5 and on the upper surface of the silicon carbide layer 2, thereby obtaining a conductive film 8'.

Then, as shown in FIGS. 7(a) and 7(b), a resist mask 22 is formed on the conductive film 8', which resist mask 22 is open in areas other than over the trench 5. Then, using the resist mask 22 as an etching mask, the conductive film 8' is dry-etched, thereby obtaining the gate electrode 8.

After removing the resist mask 22, the source electrode 10 is formed one the silicon carbide layer 2 so as to bridge between the body region 3 and the source region 4, as shown in FIGS. 8(a) and 8(b). Thus, a trench gate structure is obtained. Thereafter, the drain electrode 9 is formed on the reverse side of the substrate 1 (the surface opposite to the principal surface). Thus, a semiconductor device of the present embodiment is completed.

According to the method described above, it is possible to prevent the thinning of the gate insulating film 6 due to the surface orientation occurring on corner side surfaces of the trench 5. As a result, it is possible to effectively ease the electric field concentration at the corner portions of the trench 5, thereby increasing the breakdown electric field.

According to the method described above, the gate insulating film 6, which is thicker on the corner side surfaces of the trench 5 than on the main side surfaces thereof, can be formed without complicating the manufacturing process. Therefore, it is possible to prevent the thinning of the gate insulating film 6 due to the surface orientation occurring on corner side surfaces of the trench 5. As a result, it is possible to effectively ease the electric field concentration at the corner portions of the trench 5.

With the method described above, the thickness of portions of the gate insulating film 6 that are located on the corner side surfaces of the trench 5 (the insulating layer 6b) can be controlled by the thickness of the insulating film 17. On the other hand, the thickness of portions of the gate insulating film 6 that are located on the main side surfaces (particularly, on the channel region) (the insulating layer 6a) can be controlled by the conditions for forming the thermal oxidation film, or the like. Thus, the thicknesses of the gate insulating film 6 at different positions can be controlled independently of each other, and it is therefore possible to prevent dielectric breakdown while ensuring desirable transistor characteristics.

Note that instead of separating resist masks 21 which cover two corner portions located at each terminal portion of the cell as described above with reference to FIG. 4(d), a single resist mask 21 may be formed so as to cover the two corner portions and the main side surface therebetween. In such a case, at each terminal portion, the insulating layer 6b is formed not only on the corner side surfaces at the two corner portions but also on the main side surface located therebetween. Therefore, there is obtained the gate insulating film 6 which is thicker on these side surfaces than on the main side surfaces extending in the longitudinal direction. This gives the following advantages. Where stripe-shaped cells are used, assuming that the main side surface extending in the longitudinal direction (the z direction) of the trench 5 is the (11-20) plane, the main side surface at the terminal portions extends generally vertical to the z direction to be the (1-100) plane, for example. In such a case, if a thermal oxidation film is formed in the trench 5, it will have a greater thickness on the main side surface located at the terminal portion than on the main side surface extending in the z direction due to the surface orientation dependence of the oxidation rate. If the side surface is curved at the terminal portion, the thermal oxidation film becomes even thinner, and thus the electric field concentration is more likely to occur. Therefore, with stripe-shaped cells, the electric field concentration may be likely to occur not only at corner portions but also in portions of the terminal portion other than the corner portions. In contrast, when the insulating layer 6b is formed also on the main side surfaces in addition to the corner side surfaces located at the terminal portion as described above, the gate insulating film 6 can be made thicker not only at corner portions but also across the entire terminal portion, thus making it possible to more effectively prevent the electric field concentration.

The thickness of the gate insulating film 6 is not limited to the thickness shown in the method described above. The range of the thickness of the trench 5 on the main side surface (particularly, the thickness on the channel region) Ts is similar to the range described above in the embodiment described above. The thickness Tc on the corner side surface of the trench 5 may be set totally irrespectively of the thermal oxidation step for silicon carbide, it may be made greater than the thickness of the film formed through thermal oxidation of silicon carbide, e.g., 150 nm or more and 400 nm or less. The thickness Tc is preferably 1.5 times or more the thickness Ts, more preferably 3 times or more the thickness Ts, thereby making it possible to more effectively ease the electric field concentration. On the other hand, when the thickness Tc is too large, the area of the main side surface decreases, thereby decreasing the channel length, and it is therefore preferred that the thickness Tc is 1.5 times or less the thickness Ts.

Second Embodiment

A semiconductor device according to a second embodiment of the present invention will now be described with reference to the drawings. A semiconductor device of the present embodiment is a trench-type vertical MISFET using silicon carbide, and has a configuration with an array of a plurality of unit cells.

Figure 9:
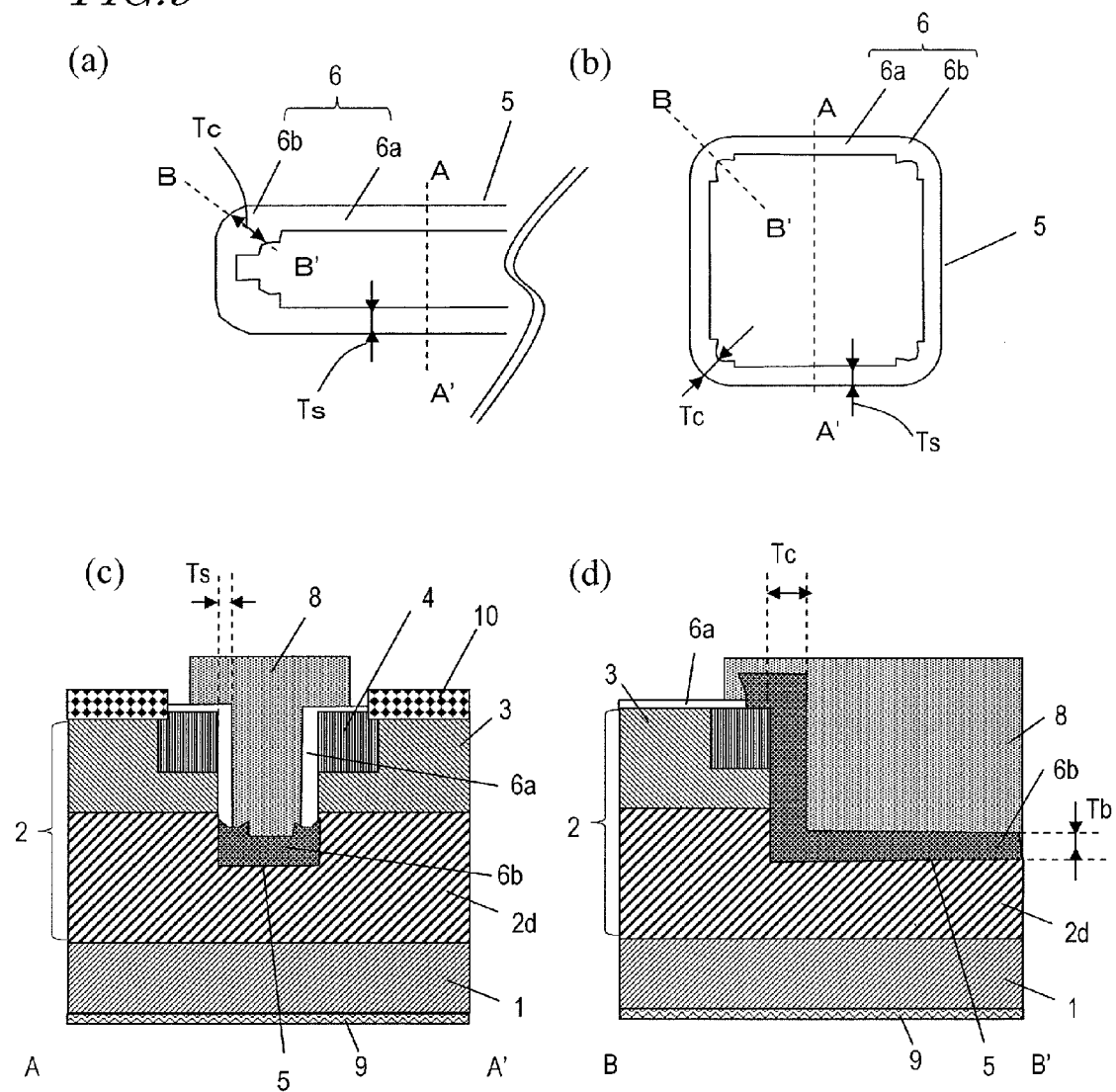
FIGS. 9 (a) and (b) are plan views showing a trench in a semiconductor device according to a second embodiment of the present invention, and (c) and (d) are cross-sectional views each showing the semiconductor device of the second embodiment.
Figure 10:
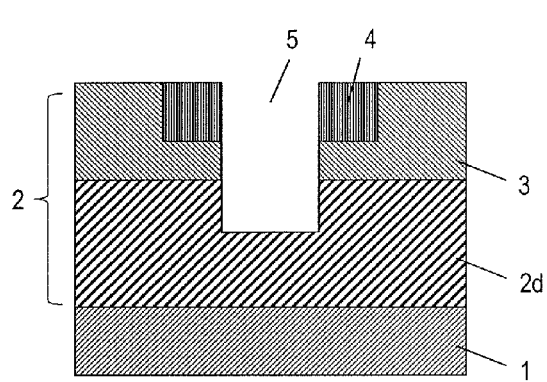
FIG. 10 (a) to (c) are diagrams each illustrating a method for manufacturing a semiconductor device of the second embodiment, wherein (a) and (b) are process cross-sectional views, and (c) is a plan view showing the trench.
Figure 10:
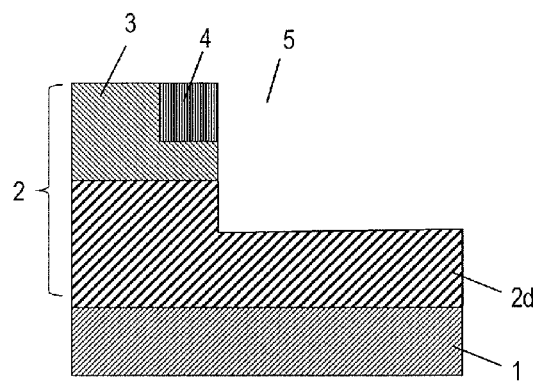
Figure 10:
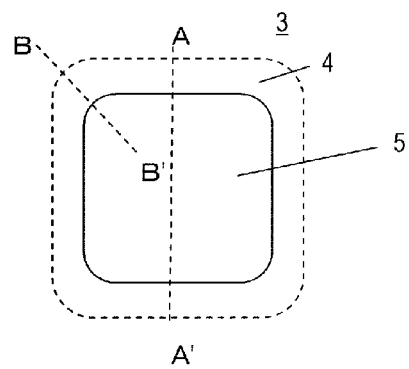
Figure 11:
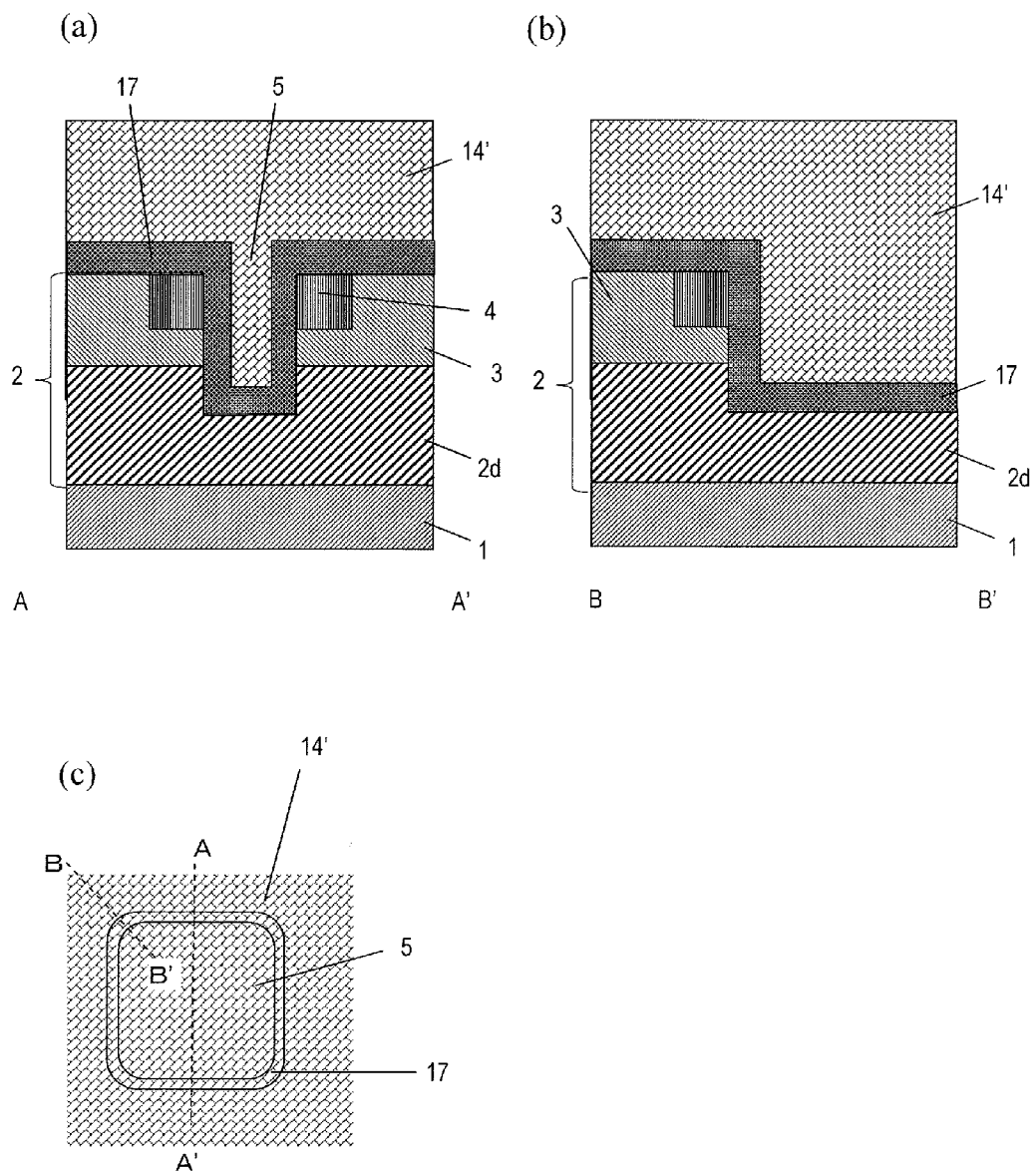
FIG. 11 (a) to (c) are diagrams each illustrating a method for manufacturing a semiconductor device of the second embodiment, wherein (a) and (b) are process cross-sectional views, and (c) is a plan view showing the trench.
Figure 12:
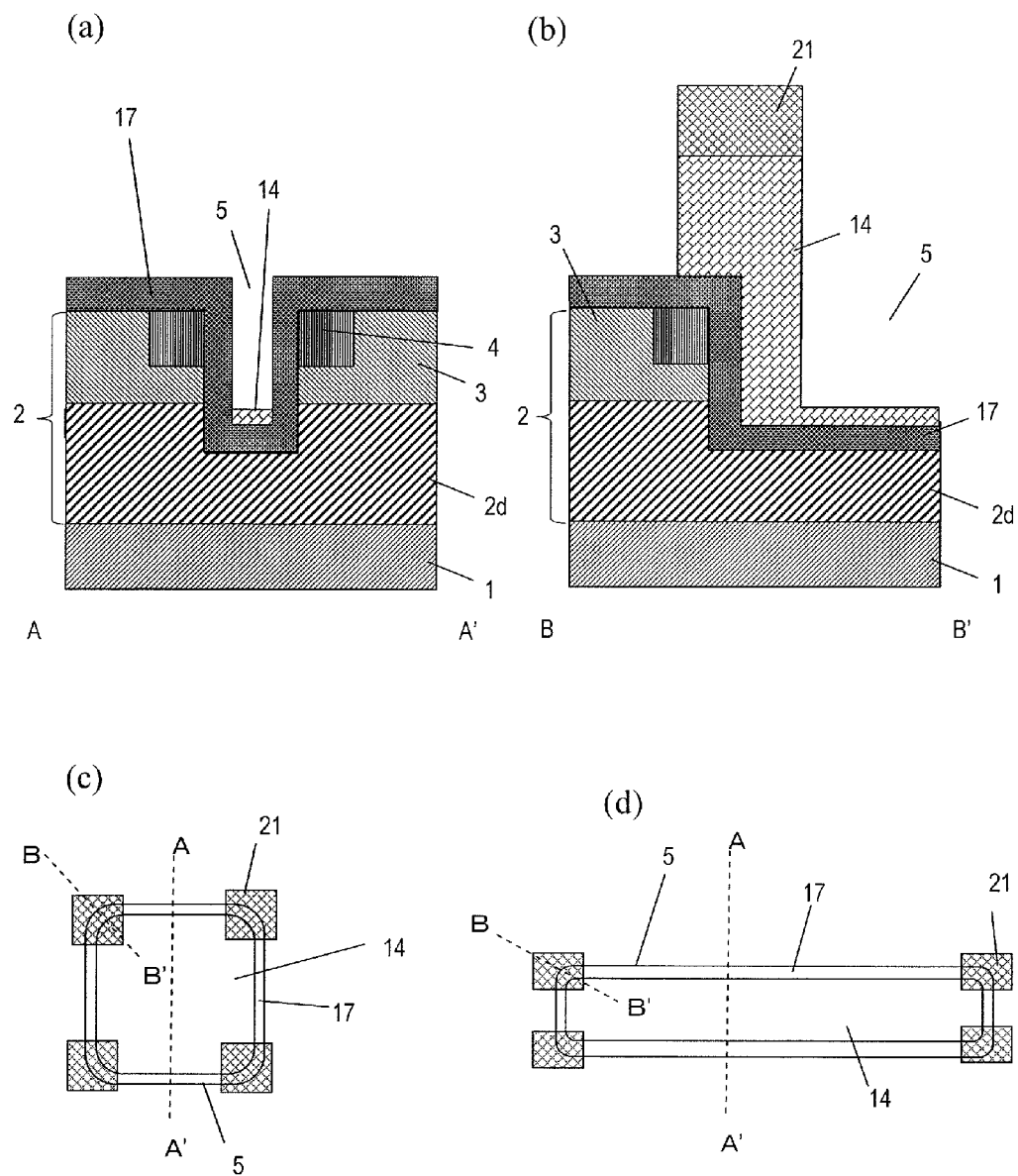
FIG. 12 (a) to (d) are diagrams each illustrating a method for manufacturing a semiconductor device of the second embodiment, wherein (a) and (b) are process cross-sectional views, and (c) and (d) are plan views showing the trench.
Figure 13:
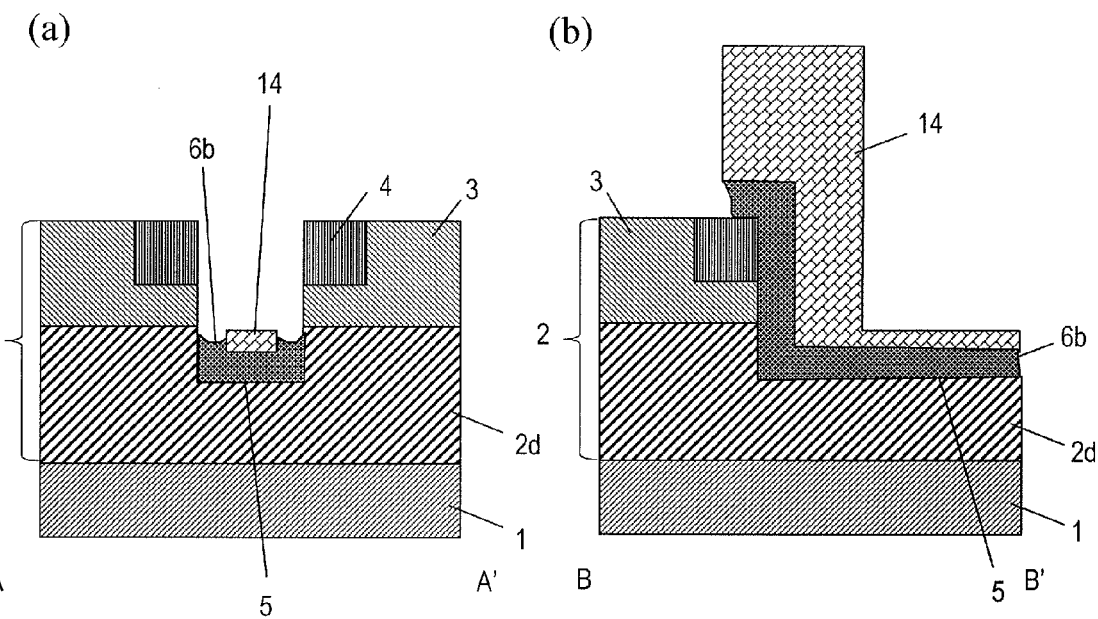
FIG. 13 (a) to (c) are diagrams each illustrating a method for manufacturing a semiconductor device of the second embodiment, wherein (a) and (b) are process cross-sectional views, and (c) is a plan view showing the trench.
Figure 13:
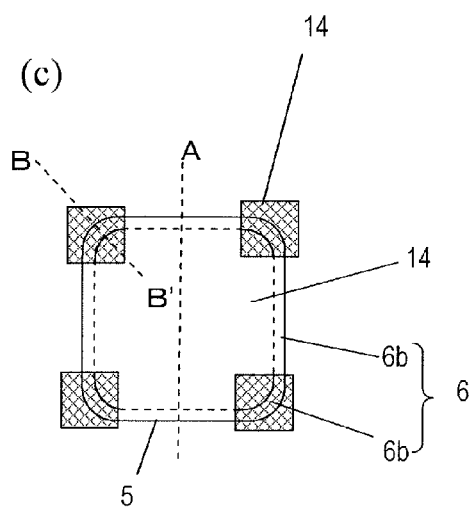
Figure 14:
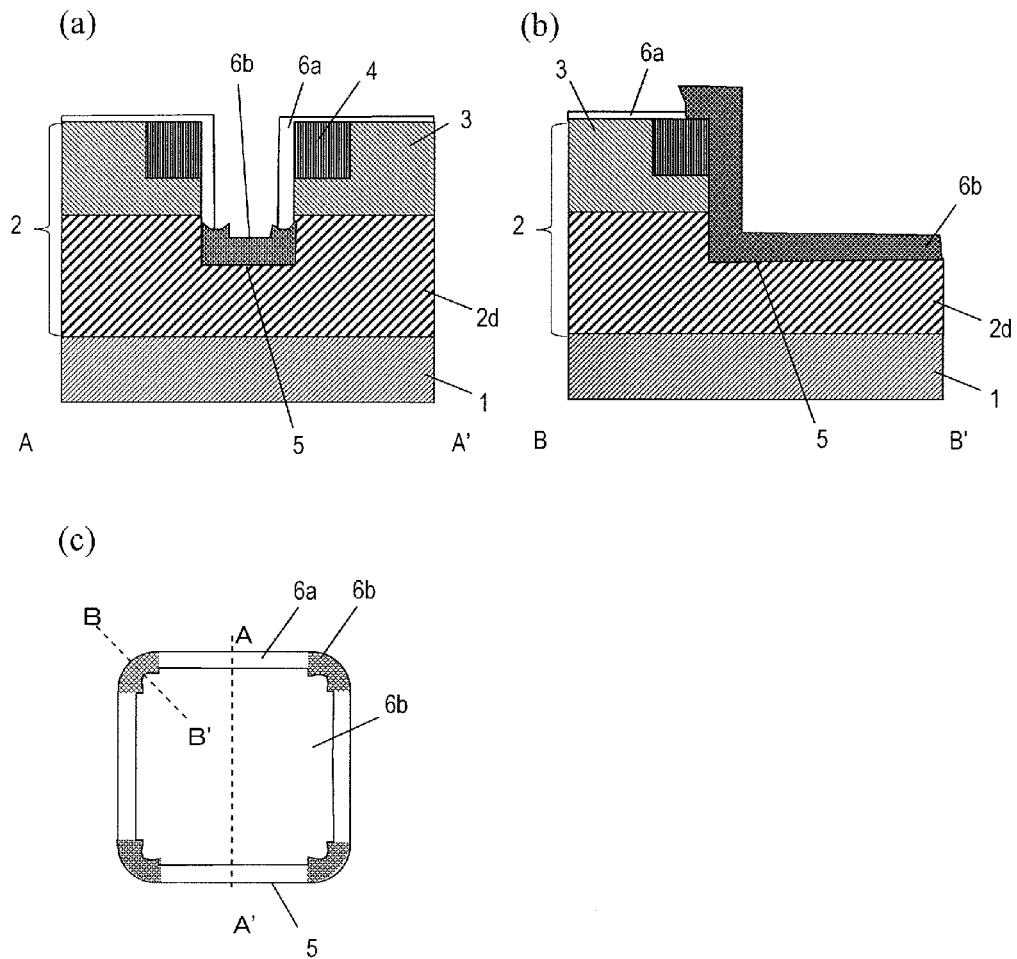
FIG. 14 (a) to (c) are diagrams each illustrating a method for manufacturing a semiconductor device of the second embodiment, wherein (a) and (b) are process cross-sectional views, and (c) is a plan view showing the trench.
Figure 15:
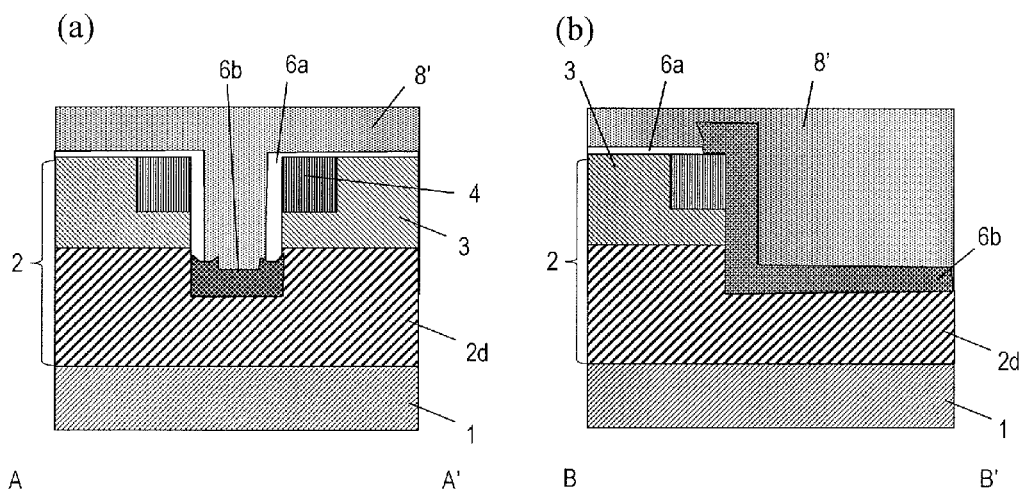
FIGS. 15 (a) and (b) are process cross-sectional views each illustrating a method for manufacturing a semiconductor device of the second embodiment.
Figure 16:
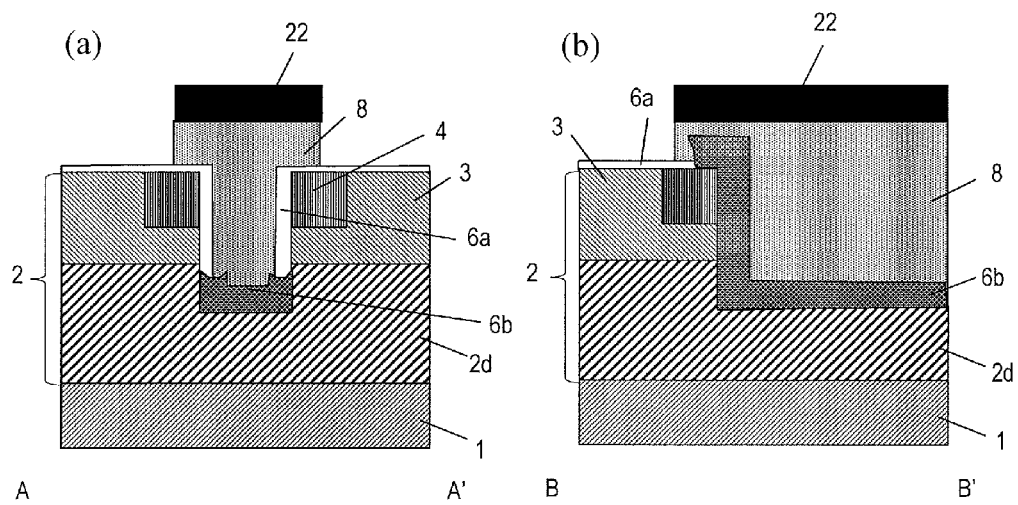
FIGS. 16 (a) and (b) are process cross-sectional views each illustrating a method for manufacturing a semiconductor device of the second embodiment.
Figure 17:
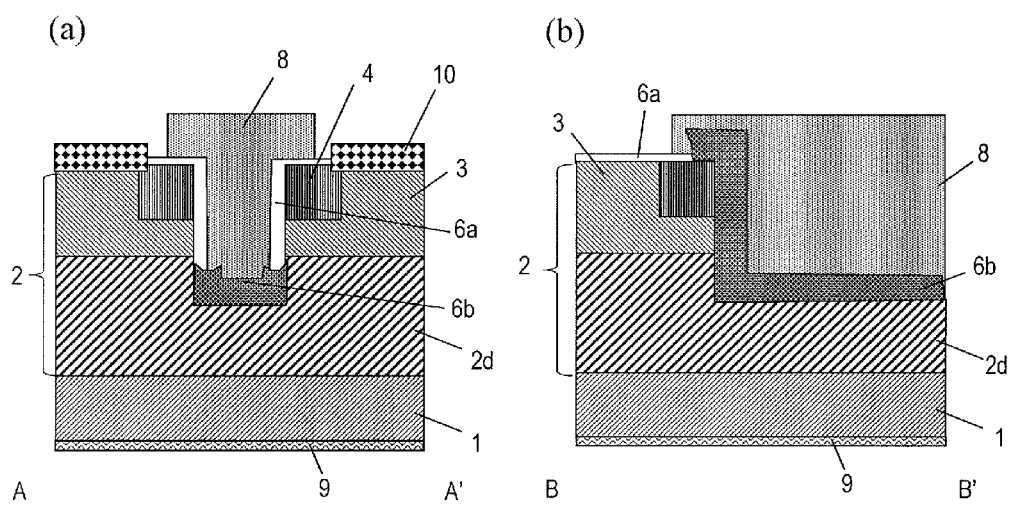
FIGS. 17 (a) and (b) are process cross-sectional views each illustrating a method for manufacturing a semiconductor device of the second embodiment.

FIGS. 9(a) and 9(b) are diagrams showing a trench and a gate insulating film arranged in a unit cell of a semiconductor device of the present embodiment, as seen from above. FIGS. 9(a) and 9(b) illustrate the planar shape of the trench 5 and the gate insulating film 6 arranged in a stripe-shaped cell and a rectangular cell, respectively. FIGS. 9(c) and 9(d) are cross-sectional views showing a unit cell of the semiconductor device of the present embodiment. FIG. 9(c) is a cross-sectional view taken along line A-A' of FIGS. 9(a) and 9(b), and FIG. 9(d) is a cross-sectional view taken along line B-B' of FIGS. 9(a) and 9(b). For the sake of simplicity, like elements to those of FIG. 1 will be denoted by like reference numerals and will not be described below.

In the semiconductor device of the present embodiment, the thicknesses Tc and Tb of the gate insulating film 6 on the corner side surface and on the bottom surface of the trench 5 are larger than the thickness Ts of the gate insulating film 6 on the main side surface. Therefore, it is possible to ease the electric field concentration occurring at the corner portion of the trench 5 and the bottom portion of the trench 5, thereby more effectively preventing dielectric breakdown.

Now, the effect of increasing the thickness of the gate insulating film 6 in the bottom portion of the trench 5 will be described in detail.

A semiconductor device having a trench structure has a problem that the electric field intensity is particularly high not only at corner portions of the trench 5 but also in the bottom portion of the trench 5. The electric field concentration in the bottom portion of the trench is a problem characteristic of semiconductor devices using a wide band gap semiconductor. This problem will now be described in detail with reference to the drawings.

Figure 41:
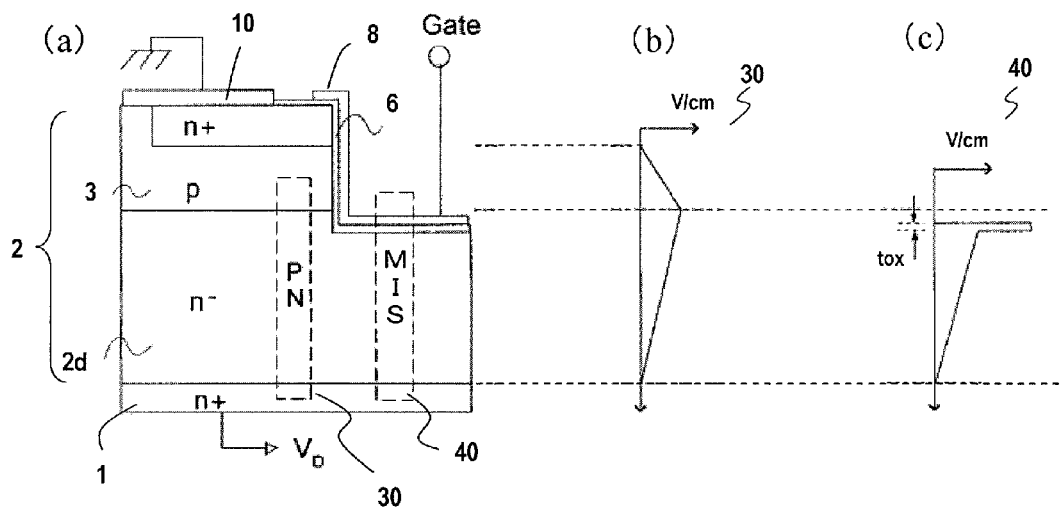
FIG. 41 (*a*) is a cross-sectional view showing an enlarged structure along broken line P of the conventional MISFET shown in FIG. 39, and (b) and (c) are diagrams showing the electric field intensity distribution in the OFF state (when the drain voltage is applied) in a PN junction 30 and an MIS structure section 40, respectively.

FIG. 41(a) is an enlarged cross-sectional view showing the structure, along broken line P, of the conventional MISFET shown in FIG. 39. FIGS. 41(b) and 41(c) show the electric field intensity distribution of the PN junction 30 and the MIS structure section 40, respectively, indicated by broken lines in FIG. 41(a), while in the OFF state (when the drain voltage is applied). The PN junction 30 is formed by the body region 3 and the drift region 2d. The MIS structure section 40 is formed by the gate electrode 8, the gate insulating film 6, and the drift region 2d.

Where a MISFET is used as a power device, a MISFET is ideally designed so that breakdown occurs when the peak electric field intensity acting on the PN junction 30 exceeds the breakdown field intensity (about 10 MV/cm) of SiC. However, before the electric field intensity acting on the PN junction 30 reaches the breakdown field intensity, the electric field intensity acting on the gate insulating film (e.g., an $SiO_2$ film) 6 in the bottom portion of the trench 5 may first reach the breakdown field intensity of SiC. Therefore, breakdown may occur at a voltage lower than the theoretical peak inverse voltage.

This is because a greater electric field intensity acts on the gate insulating film 6 of the MIS structure section 40 in an SiC power device than in an Si power device since the difference between the relative dielectric constant of SiC (9.7 for 4H—SiC) and the relative dielectric constant of an $SiO_2$ film (3.8) is smaller than the difference between the relative dielectric constant of Si (11.9) and the relative dielectric constant of an $SiO_2$ film (3.8). This is also because the electric field is typically concentrated at portions of the gate insulating film 6 that are located in the bottom portion and the corner portions of the trench, resulting in a higher electric field acting thereon than on other portions. Moreover, with an Si device, since the breakdown field intensity of Si is 0.2 MV/cm, which is lower than 10 MV/cm for an $SiO_2$ film by two orders of magnitude, breakdown occurs at the PN junction before dielectric breakdown occurs at the gate insulating film in most cases. In contrast, with an SiC power device, the breakdown field intensity of SiC (4H—SiC) is as large as 2 MV/cm, and the difference from the breakdown field intensity of an $SiO_2$ film is small (about 0.5 to 1 order of magnitude). Therefore, breakdown may possibly occur due to dielectric breakdown of the gate insulating film 6 at the MIS structure section 40 before breakdown occurs at the PN junction 30, thus making the problem of the dielectric breakdown of the gate insulating film 6 at the MIS structure section 40 more pronounced. Thus, the peak inverse voltage of the MISFET is limited by the dielectric breakdown of the gate insulating film 6, and it is difficult to realize a further increase in the peak inverse voltage.

Figure 42:
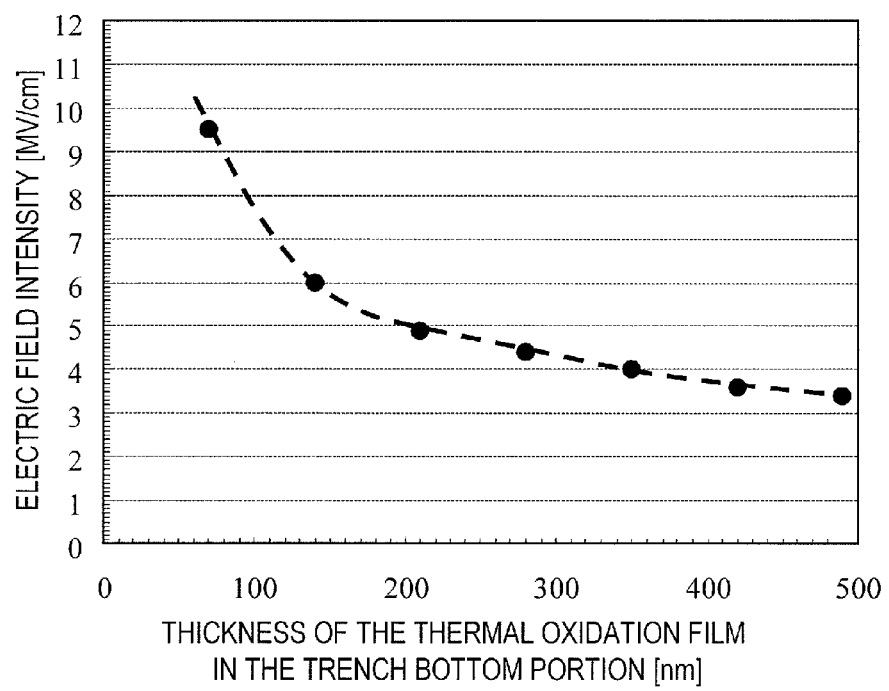
FIG. 42 A graph showing simulation results regarding the relationship between the thickness of the insulating film in the bottom surface of the trench and the electric field intensity acting on the insulating film at the trench bottom surface.

FIG. 42 shows simulation results obtained by the present inventors, showing the relationship between the thickness of the gate insulating film (thermal oxidation film) in the trench bottom portion and the electric field intensity acting on the trench bottom portion. Here, calculations are done for how the electric field acting on the trench bottom portion varies based on the thickness of the gate insulating film in the trench bottom portion when 1200 V is applied as the drain voltage. It is assumed that the thickness of the gate insulating film in the channel portion of the trench side surface is 70 nm, and the junction peak inverse voltage between the drift region and the body region is 1200 V or more.

Although the breakdown field intensity of a thermal oxidation film is normally 10 MV/cm or more, for applications to electronic devices, the acceptable electric field intensity is set to a value, e.g., 3 to 4 MV/cm, sufficiently smaller than the actual breakdown electric field in order to ensure the reliability in long-term use. That is, the electric field intensity acting in the vicinity of the trench bottom portion is set to be decreased to 4 MV/cm or less, for example.

It can be seen from the graph shown in FIG. 42 that the electric field intensity exceeds 9 MV/cm when the thickness of the gate insulating film in the trench bottom portion is about the same (70 nm) as the thickness of the gate insulating film on the trench side surface. It can be seen that an electric field of 6 MV/cm acts on the trench bottom portion even if the thickness of the gate insulating film in the trench bottom portion is set to be twice (140 nm) the thickness of the trench side surface. In order to set the electric field intensity acting on the trench bottom portion to be 4 MV/cm or less, the thickness of the gate insulating film in the trench bottom portion is set to 350 nm or more, for example, i.e., 5 times or more the thickness of the trench side surface (channel portion).

Regarding this problem, Patent Document Nos. 2 and 3 mentioned above propose increasing the thickness of the gate insulating film in the bottom portion of the trench. According to the methods proposed in these patent documents, it is difficult to sufficiently increase the thickness of the gate insulating film in the trench bottom portion while maintaining the thickness of the gate insulating film on the trench side surface (the channel region) to be a predetermined thickness. Moreover, according to these conventional methods, it is difficult to control the thickness of the gate insulating film on the trench side surface and that on the trench bottom surface individually to an intended thickness.

With the method proposed in Patent Document No. 2, the thickness of the gate insulating film on the trench bottom surface is selectively increased by utilizing the surface orientation dependence of the oxidation rate of silicon carbide. With this method, it is difficult to make the thickness of the gate insulating film in the trench bottom portion significantly larger than (e.g., 5 times or more) that on the trench side surface. Moreover, it is not possible to independently control the thickness of the gate insulating film in the trench bottom portion and that on the side surface. Therefore, it is difficult to ease the electric field acting on the trench bottom portion to be less than or equal to a predetermined value while ensuring transistor characteristics, and it may not be possible to reliably prevent dielectric breakdown of the gate insulating film.

The method proposed in Patent Document No. 3 has a problem that the process is complicated and that it is not compatible with miniaturization of unit cells. In this method, after a thick insulating film is deposited in the trench, a resist is further buried therein. Therefore, the width of the trench and the thickness of the insulating film need to be set so that a slit will remain in the trench after the deposition of a thick insulating film. Now, if the width of the trench is decreased to be small in view of device miniaturization, the thickness of the insulating film needs to be reduced, and it is difficult to increase the thickness of the insulating film in the trench bottom portion to be significantly larger than the thickness on the trench side surface. Thus, it is difficult to ease the electric field intensity acting on the trench bottom portion while decreasing the size of the unit cell to be small.

Moreover, none of the patent documents proposes a method by which the electric field intensity acting on corner portions of the trench and the electric field intensity acting on the bottom portion of the trench can be both reduced.

In contrast, in the semiconductor device of the present embodiment, the thickness of the gate insulating film 6 on the corner side surfaces of the trench 5 and on the bottom surface of the trench 5 is made greater than that on the main side surfaces. Therefore, the electric field intensity occurring at corner portions of the trench 5 and the electric field intensity occurring in the bottom portion of the trench 5 can be both reduced, and it is therefore possible to more effectively prevent dielectric breakdown.

The gate insulating film 6 of the present embodiment is formed by the insulating layer (first insulating layer) 6b provided through deposition on the side surface and the bottom surface of the trench 5, and the insulating layer (second insulating layer) 6a provided through oxidization of a surface portion (silicon carbide) of the trench 5. An oxide film, a nitride film, or the like, may be used as the insulating layer 6b. It is different from the semiconductor device of the first embodiment in that the insulating layer 6b thicker than the insulating layer 6a is formed also on the bottom surface of the trench 5. Note that where a nitride film is used as the insulating layer 6b, the insulating layer (thermal oxidation film) 6a and the insulating layer 6b can be distinguished from each other.

Manufacturing Method of Second Embodiment

Next, referring to the drawings, an example of a method for manufacturing a semiconductor device of the present embodiment will be described.

FIGS. 10 to 17 are diagrams each illustrating a method for manufacturing a semiconductor device of the present embodiment. In each figure, (a) and (b) are cross-sectional views taken along line A-A' and line B-B', respectively, of FIGS. 9(a) and 9(b), and (c) is A plan view of the trench 5.

First, as shown in FIGS. 10(a) to 10(c), the silicon carbide layer 2 including the drift region 2d of the first conductivity type (herein, n type) and the body region 3 of the second conductivity type (herein, p type) is obtained on the principal surface of the substrate 1, as in a conventional process. Then, the source region 4 is formed in the body region 3. After an annealing treatment is performed to activate the source region 4, the trench 5 is formed in the silicon carbide layer 2. The method for forming the silicon carbide layer 2 and the trench 5 is similar to the method described above with reference to FIG. 2.

Then, as shown in FIGS. 11(a) to 11(c), an insulating film 17 is formed on the main side surfaces, the corner side surfaces and the bottom surface of the trench 5. Herein, as the insulating film 17, an oxide film (thickness: about 100 nm, for example) is formed inside the trench 5 (the side surface and the bottom surface) and on the surface of the silicon carbide layer 2 by an LP-CVD method, for example.

Then, a mask material film 14' is formed on the insulating film 17. Herein, as the mask material film 14', a polysilicon film (thickness: about 500 nm, for example) is deposited by an LP-CVD method, for example.

Note that as the insulating film 17, another insulating film, such as a nitride film, may be used instead of an oxide film. Note however that since an oxide film has a smaller dielectric constant than a nitride film, it is advantageous to use an oxide film because the electric field intensity can be made smaller, for the same thickness. The method for forming the insulating film 17 is not limited to the LP-CVD method, but may be another method such as a plasma CVD method. Note however that with an LP-CVD method, it is possible to form the insulating film 17 with a better coverage (a higher coverage for the side surface of the trench 5) than with other methods, the thickness of the insulating film 17 on the side surface of the trench 5 can be controlled with a higher precision.

The material of the mask material film 14' is also not limited to polysilicon. The material of the mask material film 14' may be another material as long as the etching selectivity can be ensured to the material of the insulating film 17. Note however that it is advantageous to use a polysilicon film and select wet etching in the etching step to be described later, in which case it is possible to realize a high etching selectivity to a common insulating film such as an oxide film. Moreover, the method for forming the mask material film 14' is also not limited to the LP-CVD method, but may be another method such as a plasma CVD method. Note however that when the LP-CVD method is used, it is possible to prevent generation of voids, or the like, in the mask material film 14' since it is possible to form the mask material film 14' with a better coverage as compared with other methods. The thickness of the mask material film 14' is not limited to any particular thickness as long as it is set so that the trench 5 can be filled. For example, it may be set to a thickness that is about 50 to 100% of the opening dimension (the width of the opening) of the trench 5 after the insulating film 17 has been formed.

Then, as shown in FIGS. 12(a) to 12(c), a resist film is formed on the mask material film 14', and portions of the resist film are removed while leaving other portions that are located on the corner portions of the trench 5. Thus, a resist mask (referred to also as the second mask) 21 is obtained, which covers the corner portions of the trench 5 and exposes portions other than the corner portions.

Thereafter, using the resist mask 21 as an etching mask, the mask material film 14' is etched. Herein, by dry etching using a $CF_4$/HBr-based gas, for example, portions of the mask material film 14' exposed through the resist mask 21 are etched while leaving other portions that are covered by the resist mask 21. In this process, the etching conditions are adjusted so that the mask material remains with a thickness of 50 nm, for example, in the bottom portion of the trench 5 while removing the mask material in portions of the trench 5 other than the bottom portion. Thus, a mask material layer 14 covering the corner side surfaces of the trench 5 and the bottom surface of the trench 5 is obtained. The obtained mask material layer 14 does not cover the main side surfaces of the trench 5. Note that in the present embodiment, the mask material layer 14 corresponds to the third mask.

While dry etching is herein used as the etching of the mask material film 14', wet etching using a hydrofluoric nitric acid-based solution, for example, may be used. With dry etching, it is possible to prevent side etching under the resist mask 21.

Note that where stripe-shaped cells are used, the resist mask 21 covering corner portions of the trench 5 is formed on the insulating film 17 and the mask material film 14', as shown in FIG. 12(d), and the mask material film 14' is etched. Thus, the mask material layer 14 is obtained, which covers the corner side surfaces of the trench 5 and the bottom surface of the trench 5. Note that while the resist masks 21 covering two corner portions located at each terminal portion of the cell are separated from each other in the illustrated example, they may alternatively be connected to each other. Thus, as described above, there is obtained an advantageous effect of easing the electric field concentration not only in corner portions of the stripe-shaped cell but also in portions at terminal portions other than the corner portions.

After removing the resist mask 21, as shown in FIGS. 13(a) to 13(c), the insulating film 17 is etched using the mask material layer 14 as an etching mask. Here, the insulating film 17 is etched by wet etching using an HF-based solution, for example. Thus, portions of the insulating film 17 exposed through the mask material layer 14 are removed. Portions of the insulating film 17 that are located on the corner side surfaces of the trench 5 and the bottom surface of the trench 5 are left unremoved and become the insulating layer 6b. The insulating layer 6b is not formed on the main side surfaces of the trench 5.

Note that where stripe-shaped cells are used, the insulating layer 6b is formed on the corner side surfaces of the trench 5 and the bottom surface of the trench 5, although not shown in the figures.

Thereafter, as shown in FIGS. 14(a) to 14(c), the mask material layer 14 is removed by wet etching using a hydrofluoric nitric acid-based solution, for example. Then, the insulating layer 6a is formed in portions of the side surfaces of the trench 5 that are not covered by the insulating layer 6b. Herein, a heat treatment is performed in a dry oxidation atmosphere at a temperature of 1200° C. for three hours, for example, thereby oxidizing silicon carbide on the surface of the trench 5, thus obtaining the insulating layer (thickness: 70 nm, for example) 6a. Thus, the gate insulating film 6 is obtained, which includes the insulating layers 6a and 6b. The thickness of the insulating layer 6a (particularly, the thickness of the insulating layer 6a on the channel region) is designed in accordance with the characteristics of the semiconductor device. On the other hand, the thickness of the insulating layer 6b is designed in view of preventing dielectric breakdown, and is larger than the thickness of the insulating layer 6a. Note that also in the present embodiment, as in the embodiments above, the thickness of the insulating layer 6a formed by a heat treatment may vary due to the surface orientation dependence of the oxidation rate of silicon carbide.

Thereafter, as shown in FIGS. 15(a) and 15(b), an electrode material (e.g., doped polysilicon) to be the gate electrode is deposited in the trench 5 and on the upper surface of the silicon carbide layer 2, thereby obtaining the conductive film 8'.

Then, as shown in FIGS. 16(a) and 16(b), the conductive film 8' is dry-etched by a method similar to those of the embodiments above, thereby obtaining the gate electrode 8. Thereafter, as shown in FIGS. 17(a) and 17(b), the source electrode 10 is formed on the silicon carbide layer 2. Then, the drain electrode 9 is formed on the reverse side of the substrate 1 (the surface opposite to the principal surface). Thus, a semiconductor device of the present embodiment is completed.

According to the method described above, the gate insulating film 6, which is thicker on the corner side surfaces and the bottom surface of the trench 5 than on the main side surfaces thereof, can be formed without complicating the manufacturing process. Therefore, it is possible to prevent the thinning of the gate insulating film 6 due to the surface orientation occurring on corner side surfaces of the trench 5. As a result, it is possible to effectively ease the electric field concentration at the corner portions of the trench 5. Moreover, since it is also possible to ease the electric field concentration occurring in the bottom portion of the trench 5, it is possible to more effectively prevent dielectric breakdown.

With the method described above, the thickness of portions (the insulating layer 6b) of the gate insulating film 6 that are located on the corner side surfaces and the bottom surface of the trench 5 can be controlled by the thickness of the insulating film 17. On the other hand, the thickness of portions of the gate insulating film 6 that are located on the main side surfaces (particularly, on the channel region) (the insulating layer 6a) can be controlled by the conditions for forming the thermal oxidation film, or the like. Thus, the thicknesses of the gate insulating film 6 at different positions can be controlled independently of each other, and it is therefore possible to prevent dielectric breakdown while ensuring desirable transistor characteristics.

The thickness of the gate insulating film 6 is not limited to the thickness shown in the method described above. The range of the thickness of the trench 5 on the main side surfaces (particularly, the thickness on the channel region) Ts and the thickness Tc of the trench 5 on the corner side surfaces is similar to the range described above in the first embodiment above. The thickness Tb in the bottom portion of the trench 5 is larger than the thickness Ts, and is 100 nm or more. The thickness Tb is preferably 1.5 times or more the thickness Ts, and more preferably 5 times or more the thickness Ts. Note that the thickness Tb is set so that the upper surface of the gate insulating film 6 formed on the bottom surface of the trench 5 is located at least below the lower surface of the body region 3 (i.e., below the channel region).

Third Embodiment

A semiconductor device according to a third embodiment of the present invention will now be described with reference to the drawings. A semiconductor device of the present embodiment is a trench-type vertical MISFET using silicon carbide, and has a configuration with an array of a plurality of unit cells.

Figure 18:
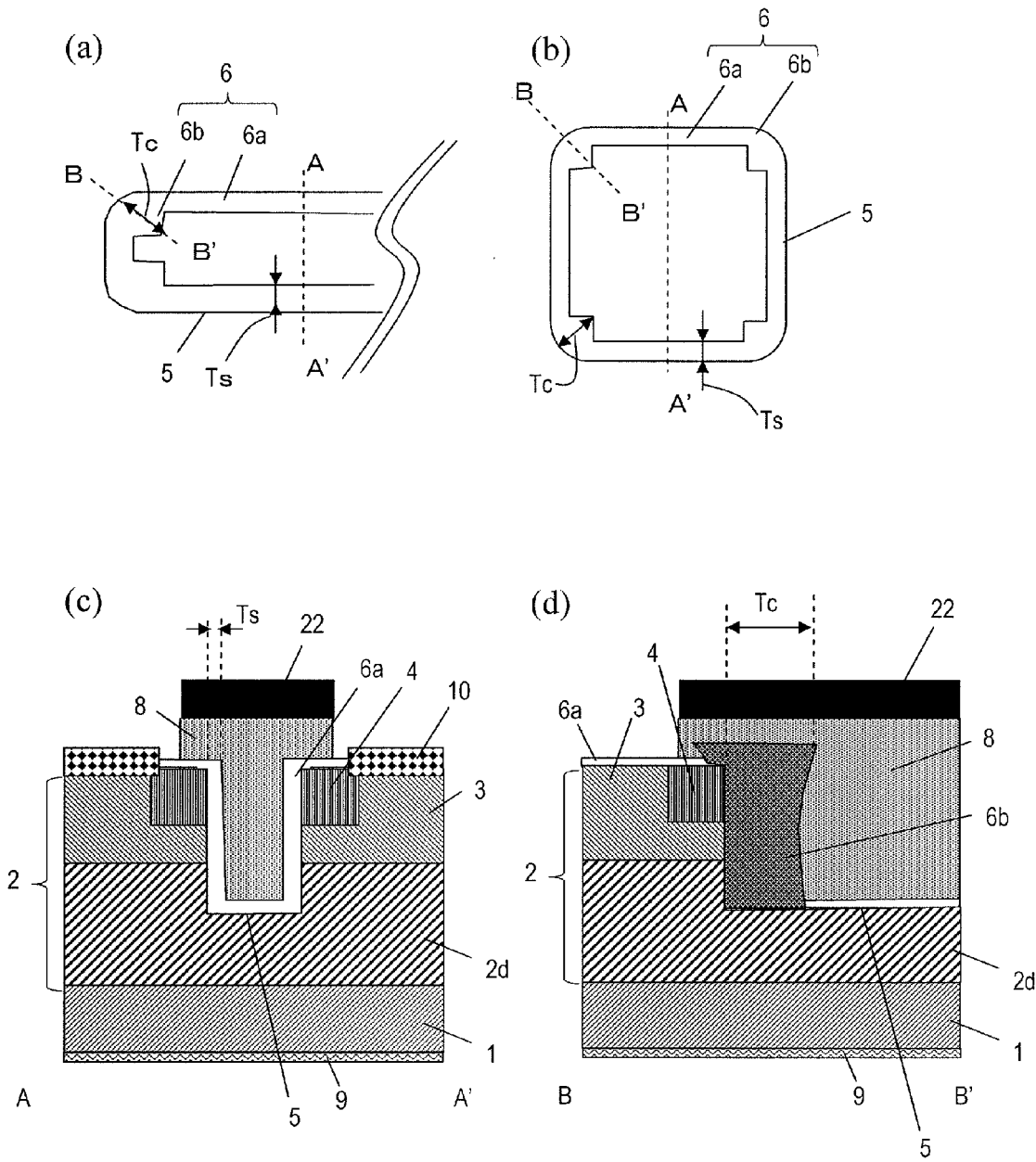
FIGS. 18 (a) and (b) are plan views showing a trench in a semiconductor device according to a third embodiment of the present invention, and (c) and (d) are cross-sectional views each showing the semiconductor device of the third embodiment.
Figure 19:
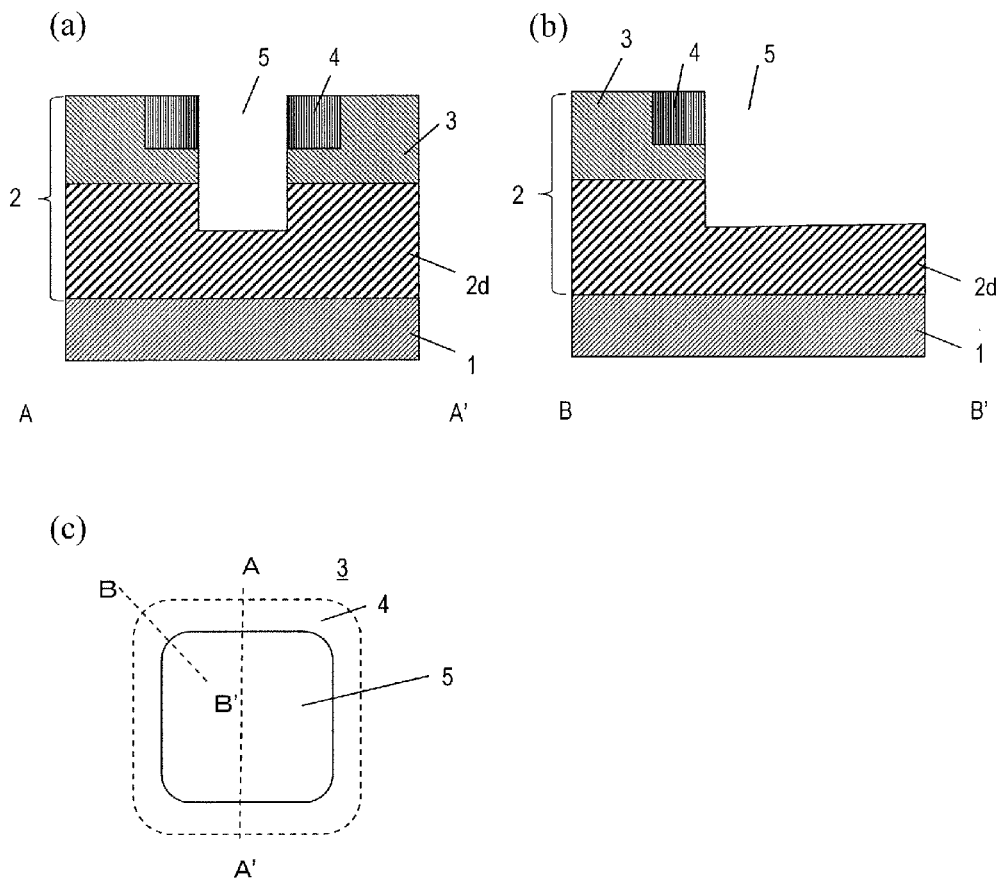
FIG. 19 (a) to (c) are diagrams each illustrating a method for manufacturing a semiconductor device of the third embodiment, wherein (a) and (b) are process cross-sectional views, and (c) is a plan view showing the trench.
Figure 20:
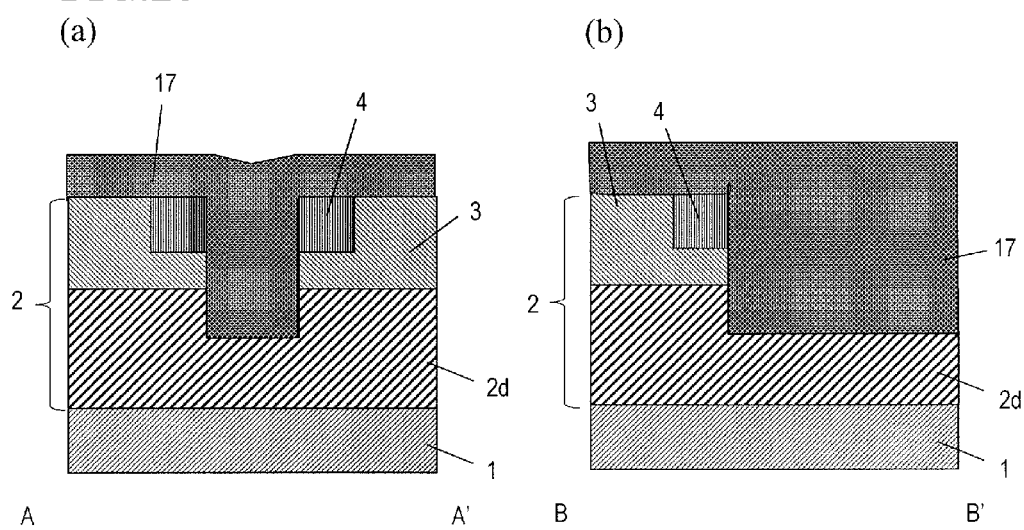
FIGS. 20 (a) and (b) are process cross-sectional views each illustrating a method for manufacturing a semiconductor device of the third embodiment.
Figure 21:
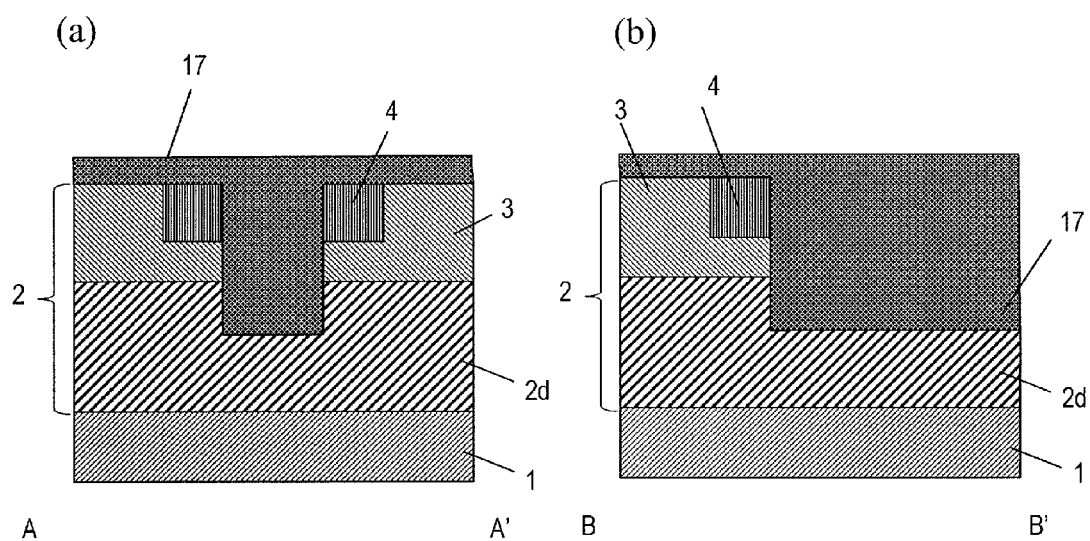
FIGS. 21 (a) and (b) are process cross-sectional views each illustrating a method for manufacturing a semiconductor device of the third embodiment.
Figure 22:
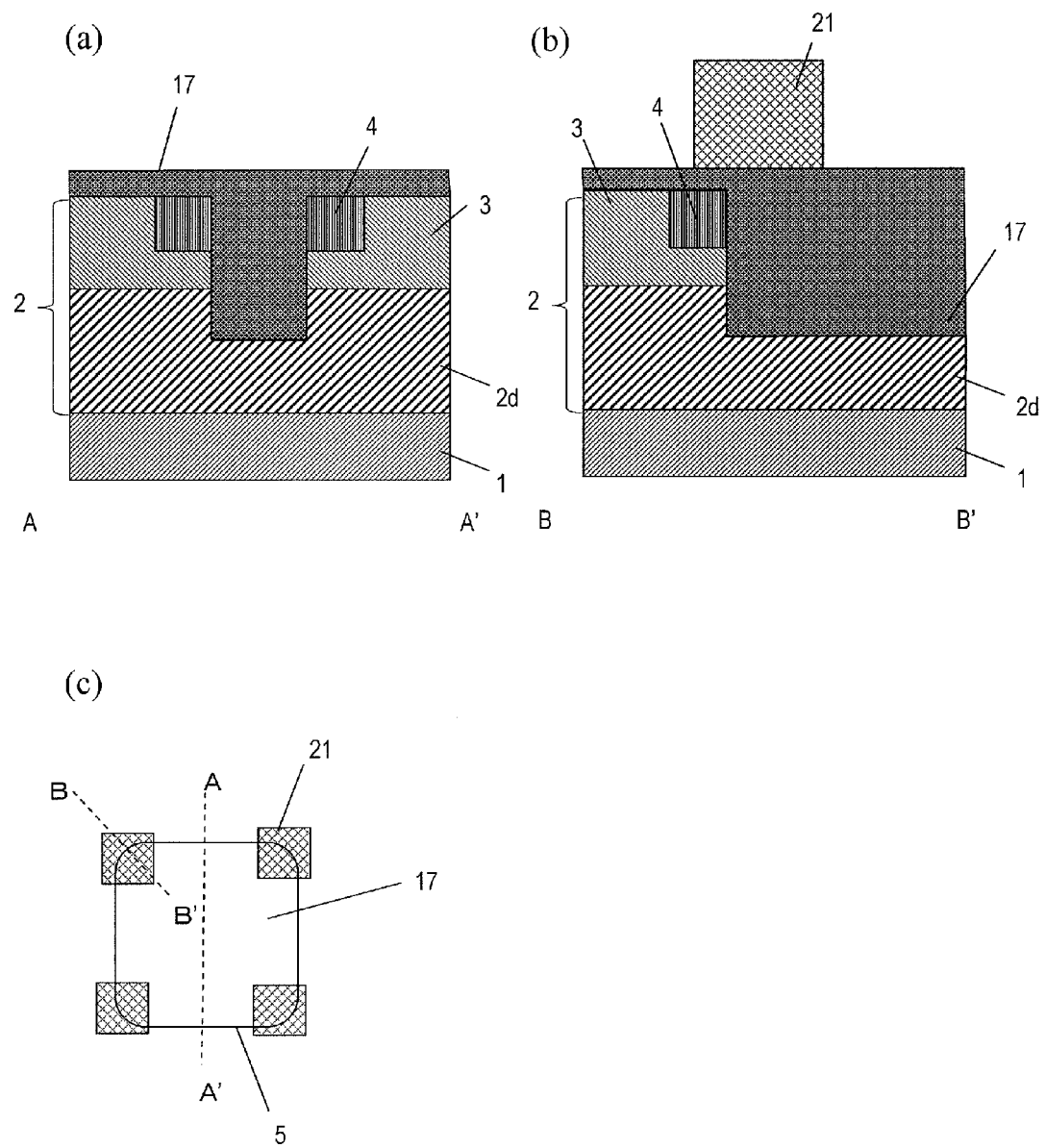
FIG. 22 (a) to (c) are diagrams each illustrating a method for manufacturing a semiconductor device of the third embodiment, wherein (a) and (b) are process cross-sectional views, and (c) is a plan view showing the trench.
Figure 23:
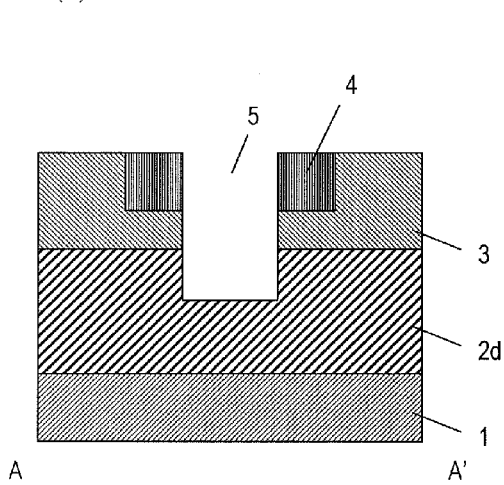
FIG. 23 (a) to (c) are diagrams each illustrating a method for manufacturing a semiconductor device of the third embodiment, wherein (a) and (b) are process cross-sectional views, and (c) is a plan view showing the trench.
Figure 23:
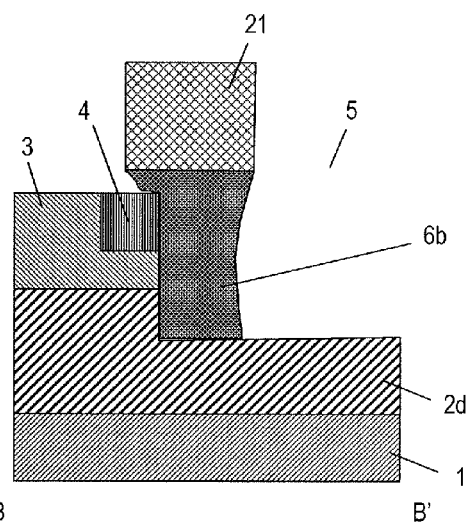
Figure 23:
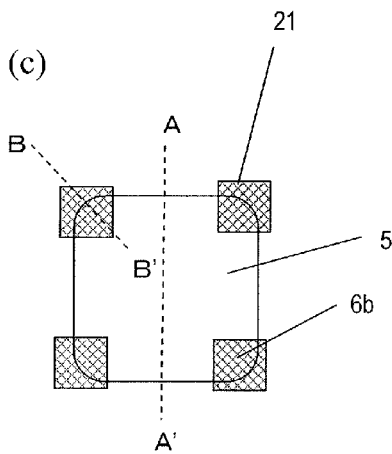
Figure 24:
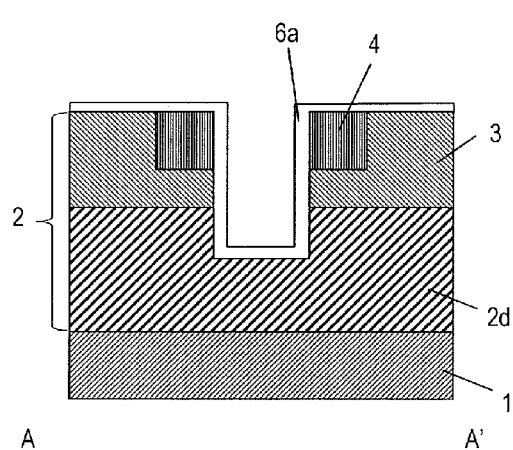
FIG. 24 (a) to (c) are diagrams each illustrating a method for manufacturing a semiconductor device of the third embodiment, wherein (a) and (b) are process cross-sectional views, and (c) is a plan view showing the trench.
Figure 24:
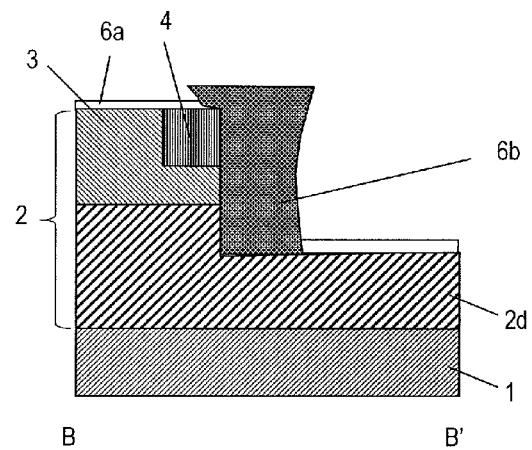
Figure 24:
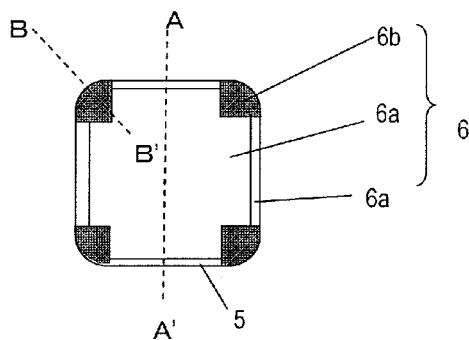
Figure 25:
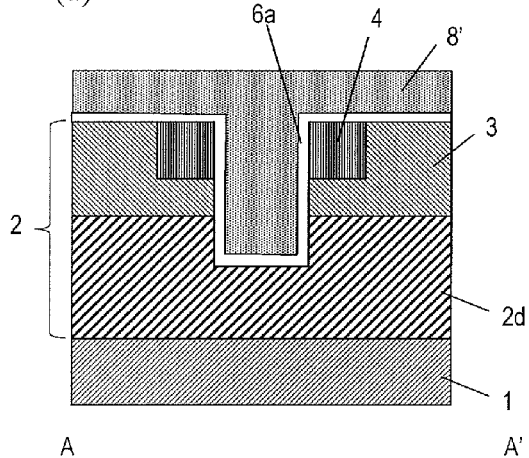
FIGS. 25 (a) and (b) are process cross-sectional views each illustrating a method for manufacturing a semiconductor device of the third embodiment.
Figure 25:
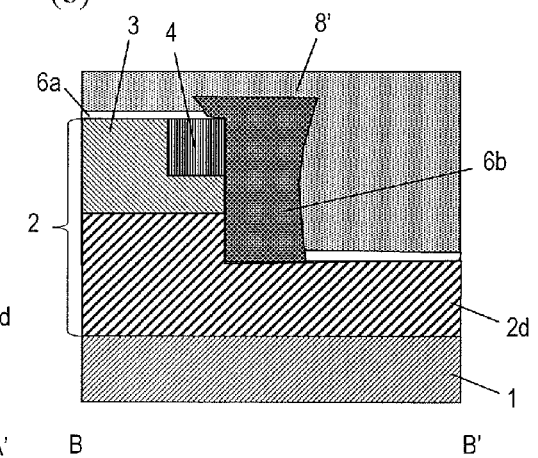
Figure 26:
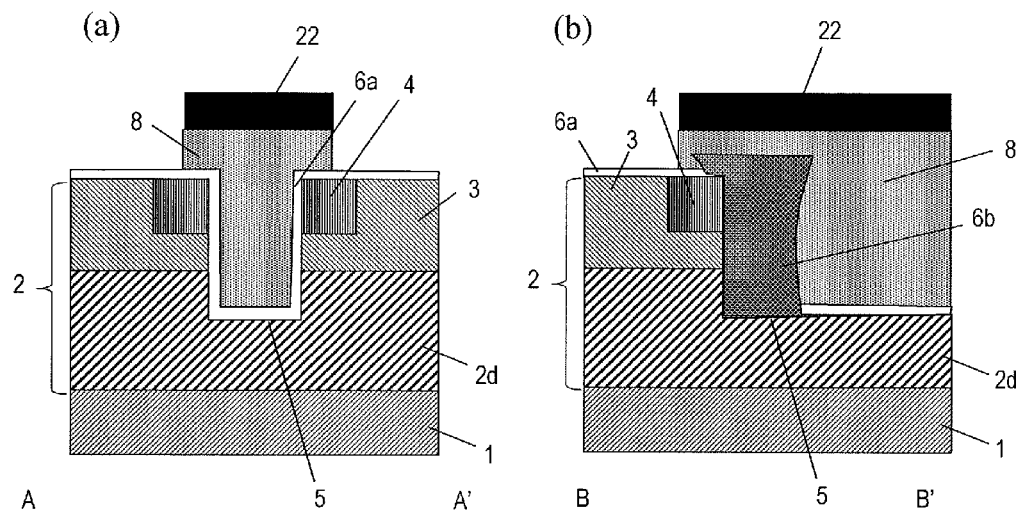
FIGS. 26 (a) and (b) are process cross-sectional views each illustrating a method for manufacturing a semiconductor device of the third embodiment.
Figure 27:
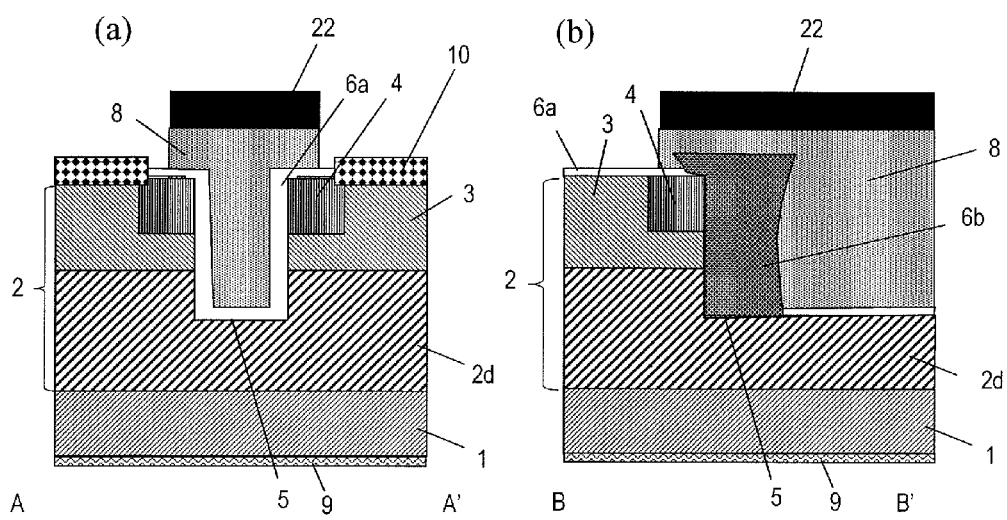
FIGS. 27 (a) and (b) are process cross-sectional views each illustrating a method for manufacturing a semiconductor device of the third embodiment.

FIGS. 18(a) and 18(b) are diagrams showing a trench and a gate insulating film arranged in a unit cell of a semiconductor device of the present embodiment, as seen from above. FIGS. 18(a) and 18(b) illustrates the planar shape of the trench 5 and the gate insulating film 6 arranged in a stripe-shaped cell and a rectangular cell, respectively. FIGS. 18(c) and 18(d) are cross-sectional views showing a unit cell of the semiconductor device of the present embodiment. FIG. 18(c) is a cross-sectional view taken along line A-A' of FIGS. 18(a) and 18(b), and FIG. 18(d) is a cross-sectional view taken along line B-B' of FIGS. 18(a) and 18(b). For the sake of simplicity, like elements to those of FIG. 1 will be denoted by like reference numerals and will not be described below.

In the semiconductor device of the present embodiment, the thickness Tc of the gate insulating film 6 on the corner side surfaces of the trench 5 is larger than the thickness Ts of the gate insulating film 6 on the main side surfaces (on the channel region). Therefore, as with the semiconductor device shown in FIG. 1, it is possible to ease the electric field concentration occurring at the corner portions of the trench 5, thereby making it possible to increase the breakdown electric field.

The gate insulating film 6 of the present embodiment includes an insulating layer (first insulating layer) 6b formed through deposition on the side surface of the trench 5, and an insulating layer (second insulating layer) 6a formed through by oxidizing a surface portion (silicon carbide) of the trench 5. An oxide film, a nitride film, or the like, may be used as the insulating layer 6b. Note that where a nitride film is used as the insulating layer 6b, the insulating layer (thermal oxidation film) 6a and the insulating layer 6b can be distinguished from each other.

Manufacturing Method of Third Embodiment

Next, referring to the drawings, an example of a method for manufacturing a semiconductor device of the present embodiment will be described.

FIGS. 19 to 27 are diagrams each illustrating a method for manufacturing a semiconductor device of the present embodiment. In each figure, (a) and (b) are cross-sectional views taken along line A-A' and line B-B', respectively, of FIGS. 18(a) and 18(b), and (c) is a plan view of the trench 5.

First, as shown in FIGS. 19(a) to 19(c), the silicon carbide layer 2 including the drift region 2d of the first conductivity type (herein, n type) and the body region 3 of the second conductivity type (herein, p type) is obtained on the principal surface of the substrate 1, as in a conventional process. Then, the source region 4 is formed in the body region 3. After an annealing treatment is performed to activate the source region 4, the trench 5 is formed in the silicon carbide layer 2. The method for forming the silicon carbide layer 2 and the trench 5 is similar to the method described above with reference to FIG. 2.

Then, as shown in FIGS. 20(a) and 20(b), the insulating film 17 is formed on the main side surfaces, the corner side surfaces and the bottom surface of the trench 5. Herein, as the insulating film 17, an oxide film (thickness: about 600 nm, for example) containing an impurity (e.g., phosphorus), for example, is formed inside the trench 5 (the side surface and the bottom surface) and on the surface of the silicon carbide layer 2 by an LP-CVD method, for example. In this process, the thickness of the insulating film 17 and the width, the shape, and the like, of the trench 5 may be controlled so that the trench 5 is filled by the insulating film 17 and no voids are produced inside the trench 5. The term "void" as used herein refers to a minute space (width: about 5 nm or more, for example) produced inside the insulating film 17.

Although not shown in the figures, the insulating film 17 buried in the trench 5 may include a slit. The term "slit" refers to a minute gap (a portion where the insulating film is not formed) in the insulating film 17 extending from the upper surface of the insulating film 17 to a predetermined depth in the trench 5.

In such a case, although not shown in the figures, a heat treatment (annealing treatment) is performed so that the slit formed in the trench 5 disappears by virtue of mixing. Herein, a heat treatment is performed at a temperature of 800° C. for 60 minutes, for example. In the present embodiment, the insulating film 17 contains an impurity (phosphorus), and the melting point of the insulating film 17 is therefore decreased so that the insulating film 17 easily softens by a heat treatment. Therefore, atoms more easily travel through the insulating film 17 in the trench 5, thereby allowing the insulating film 17 to flow to fill the slit. As a result, the slit can be made to disappear.

Note that where voids have been produced inside the insulating film 17, voids may possibly not disappear and remain despite mixing. Therefore, the formation of the insulating film 17 is performed herein by such a method and conditions that as few voids as possible will be contained.

While an impurity is introduced into the insulating film 17 so that mixing occurs more easily in the present embodiment, the insulating film 17 may include no impurity. While an oxide film deposited by an LP-CVD method is used as the insulating film 17, the method and material by which the insulating film 17 is formed are not limited to any method and material as long as the insulating film 17 can be deposited in the trench 5 without voids. The insulating film 17 is not limited to an oxide film, and may be a nitride film, for example. Where the insulating film 17 can be deposited without voids or slits, mixing does not need to be done, and it is therefore possible to skip the annealing treatment step (mixing step).

In the present specification, "filling the trench 5" with the insulating film 17 refers to a state where the inside of the trench 5, i.e., the space defined by the bottom surface and the side surface of the trench 5, is filled by the insulating film 17 (where mixing is done, the insulating film 17 after mixing has been done) formed on the bottom surface and the side surface of the trench 5. In this state, the insulating film 17 may be formed so as to completely fill the inside of the trench 5, with no voids or slits inside the trench 5.

Thereafter, as shown in FIGS. 21(a) and 21(b), the surface of the insulating film 17 is flattened by the chemical mechanical polishing (CMP) method, for example.

Note that while the CMP method is used in the present embodiment, another flattening method may be used instead of the CMP method, e.g., after an organic film is applied and flattened on the surface of the insulating film 17, organic film and the insulating film 17 may be etched back at generally the same etching rate. The flattening step for the surface of the insulating film 17 may be skipped.

Then, as shown in FIGS. 22(a) to 22(c), a resist film is formed on the insulating film 17, and portions of the resist film are removed while leaving other portions that are located on the corner portions of the trench 5. Thus, a resist mask (referred to also as the third mask) 21 is obtained, which covers the corner portions of the trench 5 and exposes portions other than the corner portions.

Note that although not shown in the figures, where stripe-shaped cells are used, the resist mask 21 is formed on the insulating film 17, which has been formed inside the trench 5 and on the silicon carbide layer 2, so as to cover the corner portions of the trench 5. Note that while the resist masks 21 covering two corner portions located at each terminal portion of the cell are separated from each other in the illustrated example, they may alternatively be connected to each other, as in the embodiments above.

Then, as shown in FIGS. 23(a) to 23(c), using the resist mask 21 as an etching mask, the insulating film 17 is etched. Herein, the insulating film 17 is etched by a combination of dry etching and wet etching. Specifically, the insulating film 17 is first etched by dry etching using a $CHF_3$ gas, or the like, and portions thereof are removed while leaving other portions thereof that are covered by the resist mask 21. Then, the insulating film 17 remains, as a side wall (not shown), on the main side surface of the trench 5. The side wall is removed by wet etching using an HF-based solution, for example. Thus, portions of the insulating film 17 that are exposed through the resist mask 21 are removed, while other portions thereof that are covered by the resist mask 21 are left unremoved and become the insulating layer 6b. Thus, the insulating layer 6b is obtained on the corner side surfaces of the trench 5.

While wet etching is herein used for the etching of the side wall, the reason is that a wet etching solution for an insulating film typically does not corrode silicon carbide. Note that the side wall may instead be removed by isotropic dry etching. In this case, a gas that does not etch silicon carbide may be selected.

Note that although not shown in the figures, where stripe-shaped cells are used, the insulating layer 6b is formed on the side surface at each corner portion of the trench 5.

After removing the resist mask 21, the insulating layer 6b is formed in portions of the side surface and the bottom surface of the trench 5 that are not covered by the insulating layer 6b, as shown in FIGS. 24(a) to 24(c). Herein, a heat treatment is performed in a dry oxidation atmosphere at a temperature of 1200° C. for three hours, for example, thereby oxidizing silicon carbide on the surface of the trench 5, thus obtaining the insulating layer (thickness: 70 nm, for example) 6a. Thus, the gate insulating film 6 is obtained, which includes the insulating layers 6a and 6b. The thickness of the insulating layer 6a (particularly, the thickness of the insulating layer 6a on the channel region) is designed in accordance with the characteristics of the semiconductor device. On the other hand, the thickness of the insulating layer 6b is designed in view of preventing dielectric breakdown, and is larger than the thickness of the insulating layer 6a. Note that also in the present embodiment, as in the embodiments above, the thickness of the insulating layer 6a formed by a heat treatment may vary due to the surface orientation dependence of the oxidation rate of silicon carbide.

Thereafter, as shown in FIGS. 25(a) and 25(b), an electrode material (e.g., doped polysilicon) to be the gate electrode is deposited in the trench 5 and on the upper surface of the silicon carbide layer 2, thereby obtaining a conductive film 8'.

Then, by a method similar to those of the embodiments above, the conductive film 8' is dry-etched by using a resist mask 22 that covers the trench 5 and the surrounding area and that is open in the other area, as shown in FIGS. 26(a) and 26(b), thereby obtaining the gate electrode 8. Thereafter, as shown in FIGS. 27(a) and 27(b), the source electrode 10 is formed on the silicon carbide layer 2. Then, the drain electrode 9 is formed on the reverse side of the substrate 1 (the surface opposite to the principal surface). Thus, a semiconductor device of the present embodiment is completed.

According to the method described above, the gate insulating film 6, which is thicker on the corner side surfaces of the trench 5 than on the main side surfaces thereof, can be formed without complicating the manufacturing process. Therefore, it is possible to prevent the thinning of the gate insulating film 6 due to the surface orientation occurring on corner side surfaces of the trench 5. As a result, it is possible to effectively ease the electric field concentration at the corner portions of the trench 5.

With the method described above, the thickness of portions (the insulating layer 6b) of the gate insulating film 6 that are located on the corner side surfaces of the trench 5 can be controlled by the pattern of the resist mask 21. On the other hand, the thickness of portions of the gate insulating film 6 that are located on the main side surfaces (particularly, on the channel region) (the insulating layer 6a) can be controlled by the conditions for forming the thermal oxidation film, or the like. Thus, the thicknesses of the gate insulating film 6 at different positions can be controlled independently of each other, and it is therefore possible to prevent dielectric breakdown while ensuring desirable transistor characteristics.

The thickness of the gate insulating film 6 is not limited to the thickness shown in the method described above. The range of the thickness of the trench 5 on the main side surfaces (particularly, the thickness on the channel region) Ts and the thickness Tc of the trench 5 on the corner side surfaces is similar to the range described above in the first embodiment above.

Fourth Embodiment

A semiconductor device according to a fourth embodiment of the present invention will now be described with reference to the drawings. A semiconductor device of the present embodiment is a trench-type vertical MISFET using silicon carbide, and has a configuration with an array of a plurality of unit cells.

Figure 28:
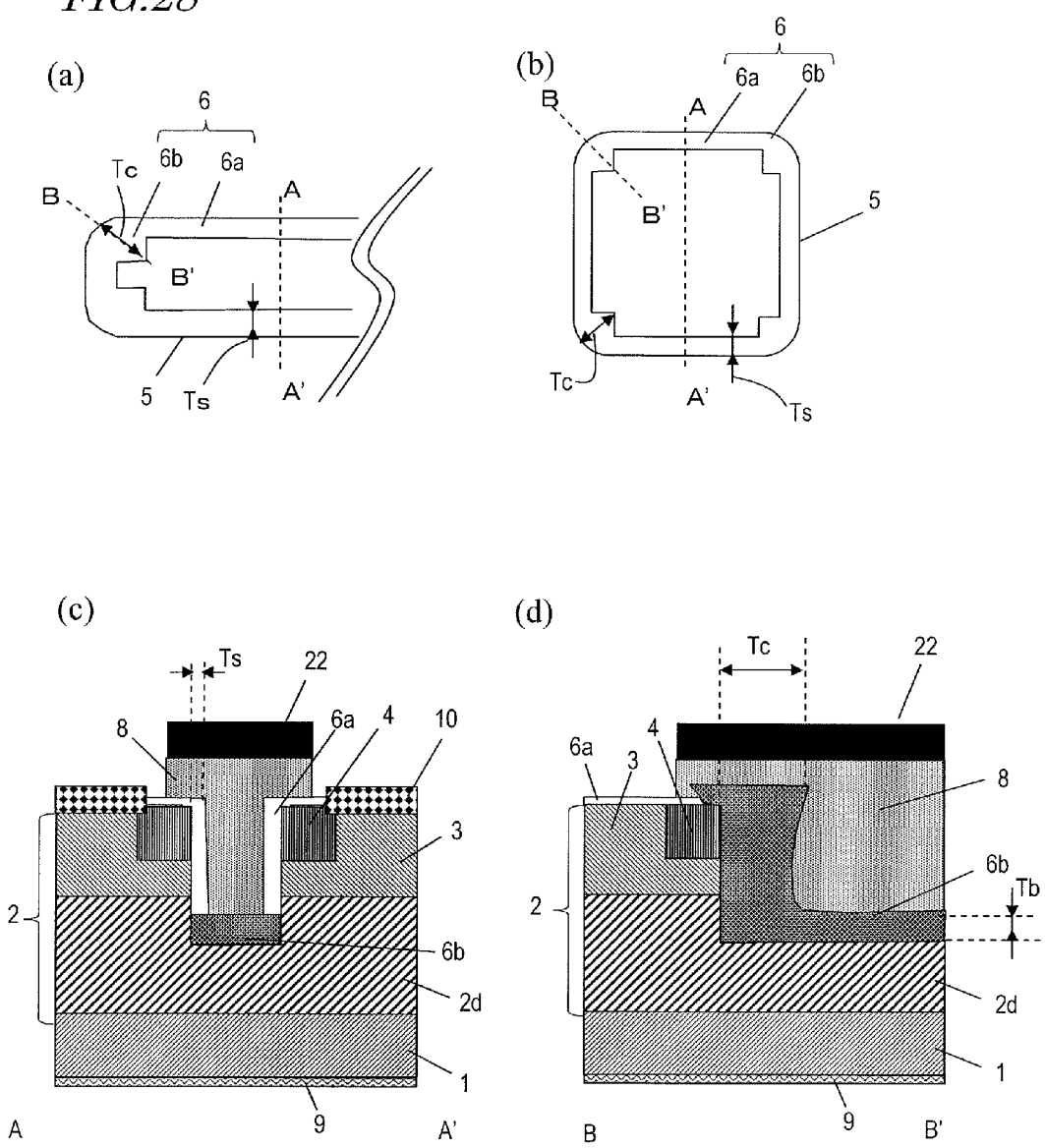
FIGS. 28 (a) and (b) are plan views showing a trench in a semiconductor device according to a fourth embodiment of the present invention, and (c) and (d) are cross-sectional views each showing the semiconductor device of the fourth embodiment.
Figure 29:
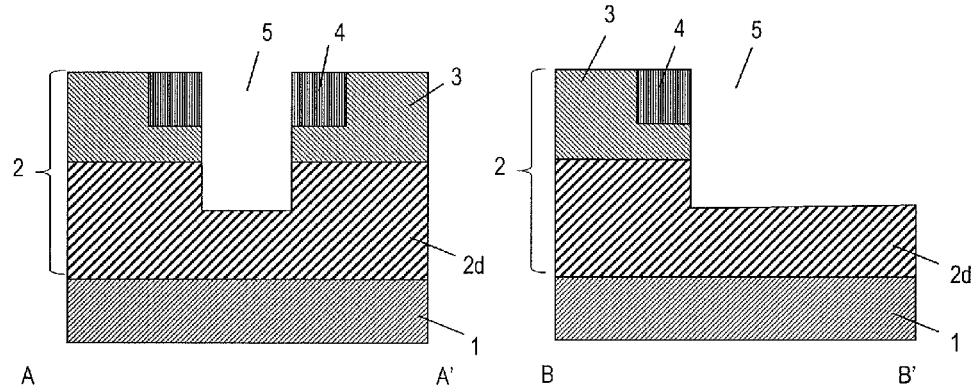
FIG. 29 (a) to (c) are diagrams each illustrating a method for manufacturing a semiconductor device of the fourth embodiment, wherein (a) and (b) are process cross-sectional views, and (c) is a plan view showing the trench.
Figure 29:
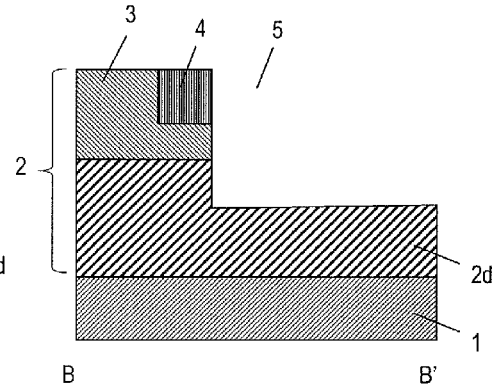
Figure 29:
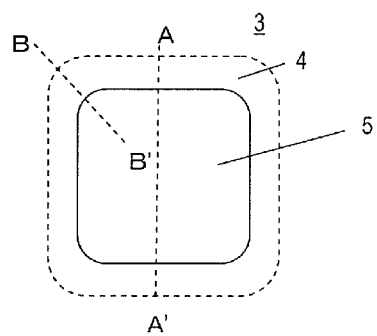
Figure 30:
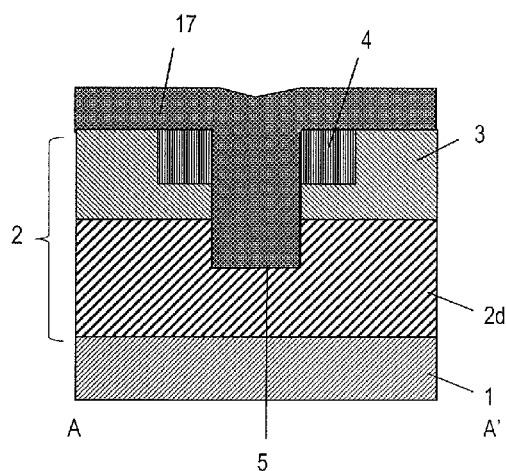
FIGS. 30 (a) and (b) are process cross-sectional views each illustrating a method for manufacturing a semiconductor device of the fourth embodiment.
Figure 30:
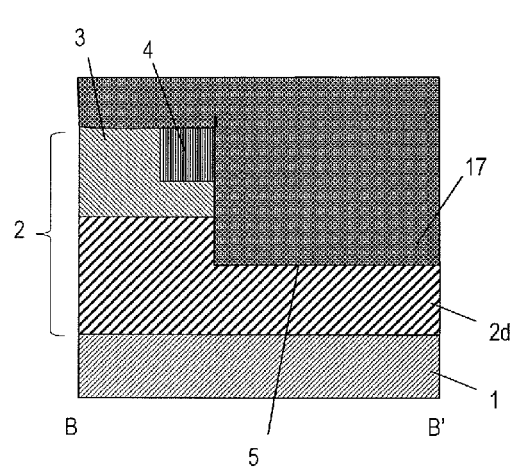
Figure 31:
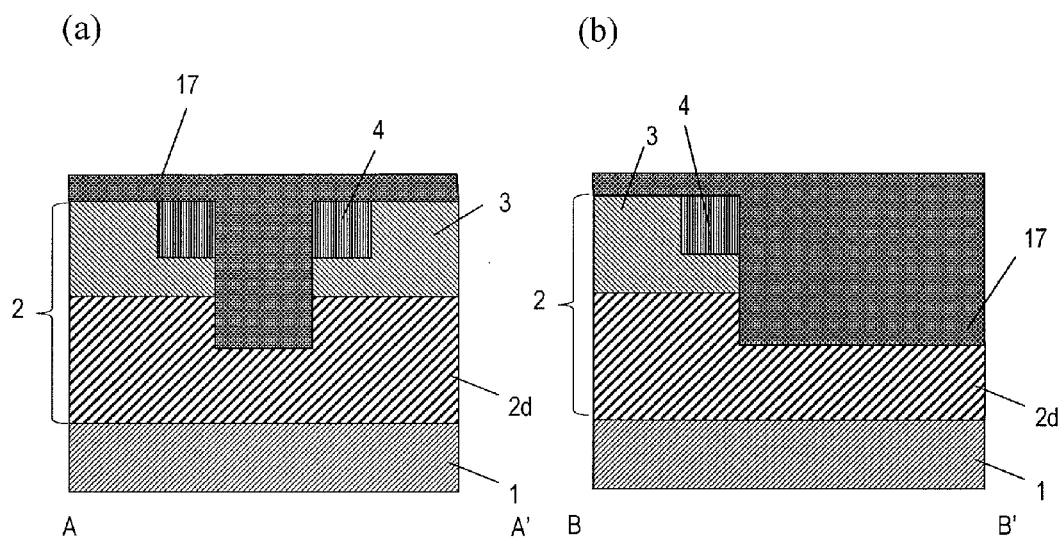
FIGS. 31 (a) and (b) are process cross-sectional views each illustrating a method for manufacturing a semiconductor device of the fourth embodiment.
Figure 32:
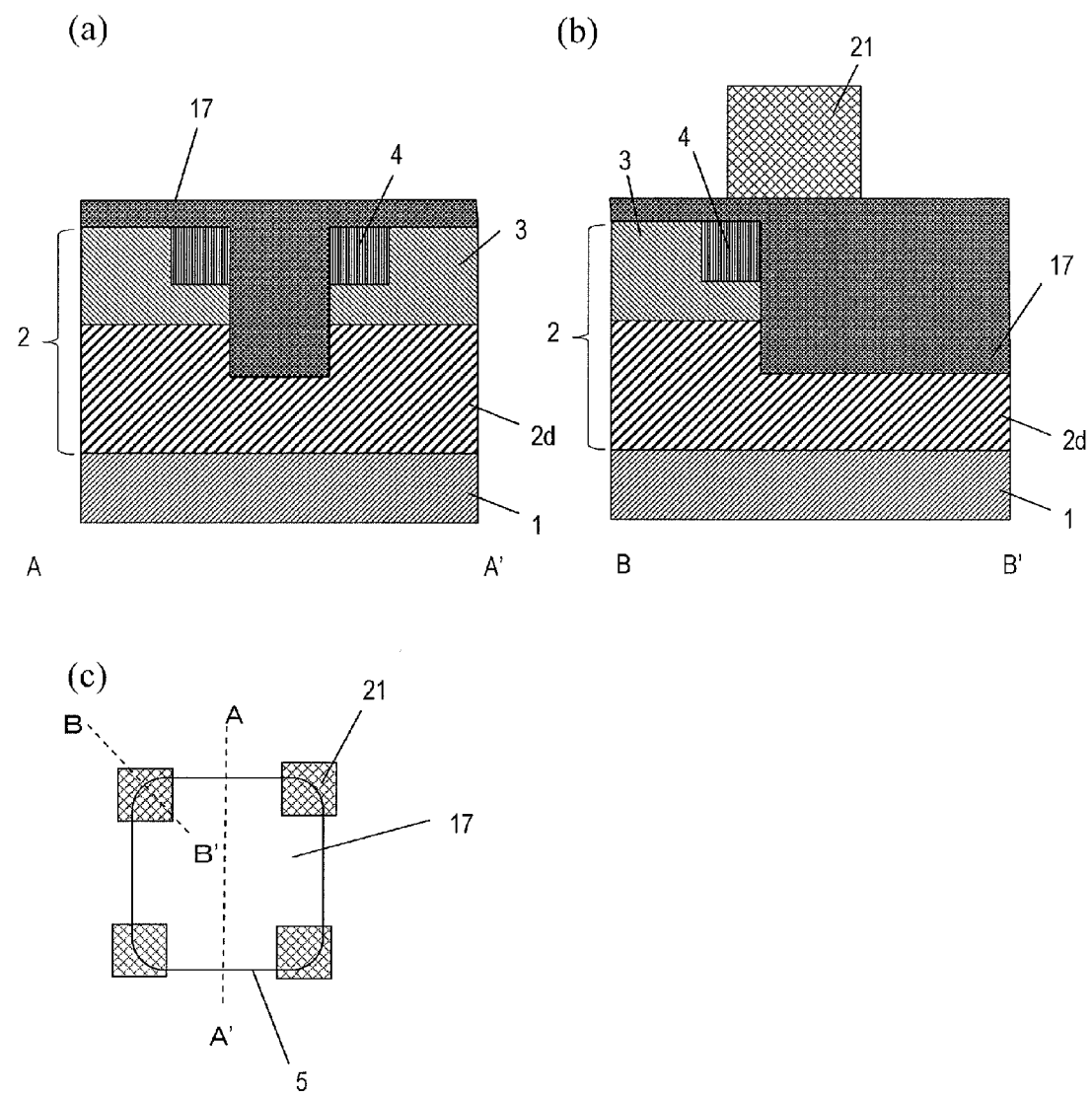
FIG. 32 (a) to (c) are diagrams each illustrating a method for manufacturing a semiconductor device of the fourth embodiment, wherein (a) and (b) are process cross-sectional views, and (c) is a plan view showing the trench.
Figure 33:
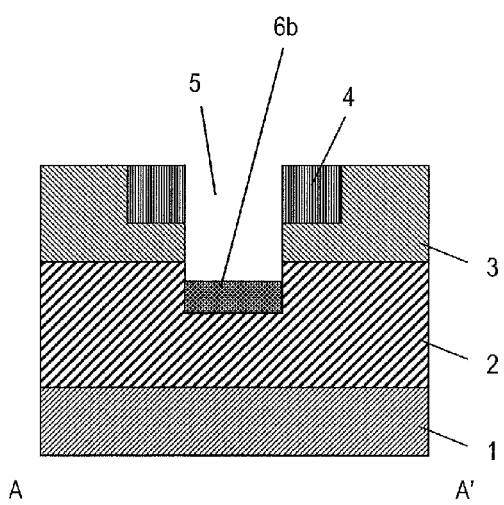
FIG. 33 (a) to (c) are diagrams each illustrating a method for manufacturing a semiconductor device of the fourth embodiment, wherein (a) and (b) are process cross-sectional views, and (c) is a plan view showing the trench.
Figure 33:
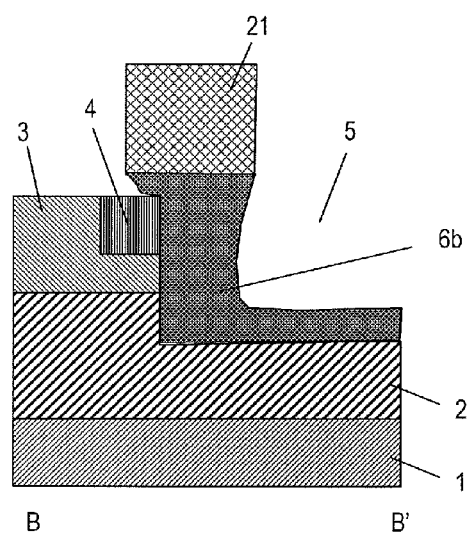
Figure 33:
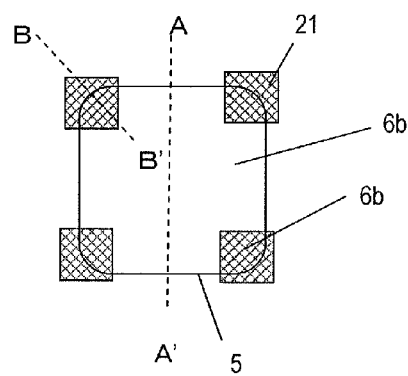
Figure 34:
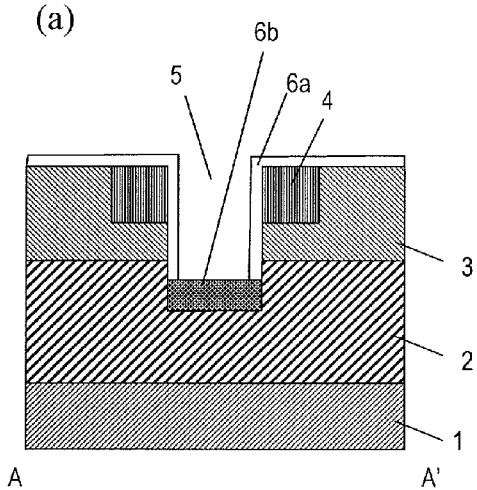
FIG. 34 (a) to (c) are diagrams each illustrating a method for manufacturing a semiconductor device of the fourth embodiment, wherein (a) and (b) are process cross-sectional views, and (c) is a plan view showing the trench.
Figure 34:
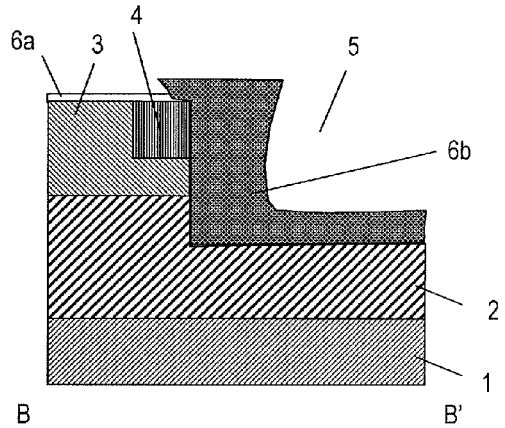
Figure 34:
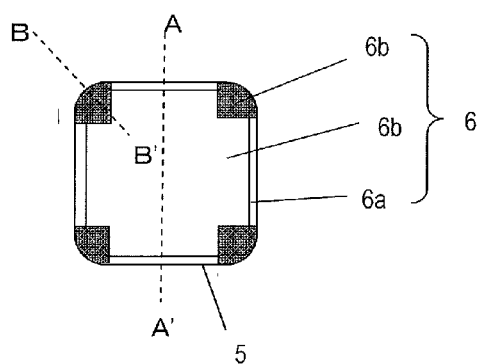
Figure 35:
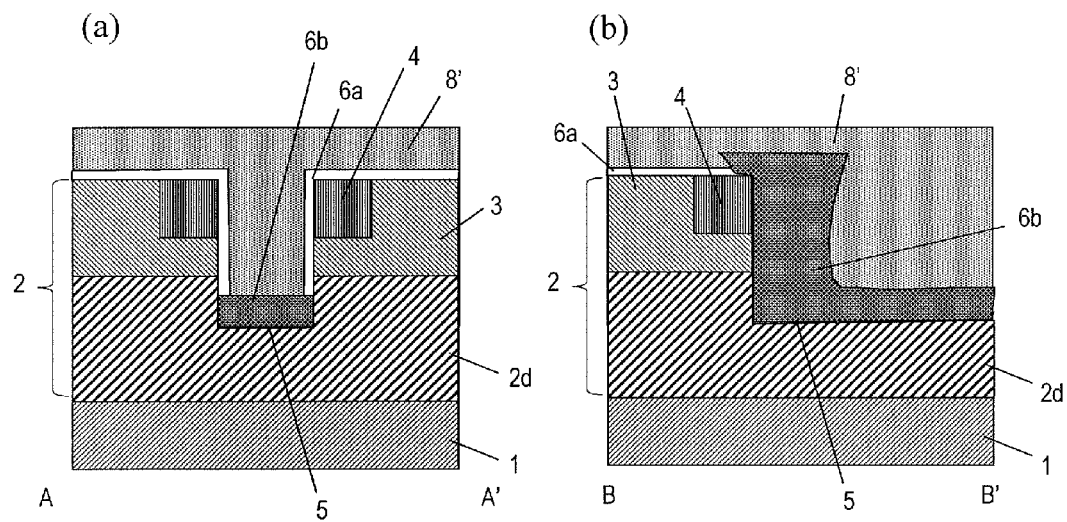
FIGS. 35 (*a*) and (*b*) are process cross-sectional views each illustrating a method for manufacturing a semiconductor device of the fourth embodiment.
Figure 36:
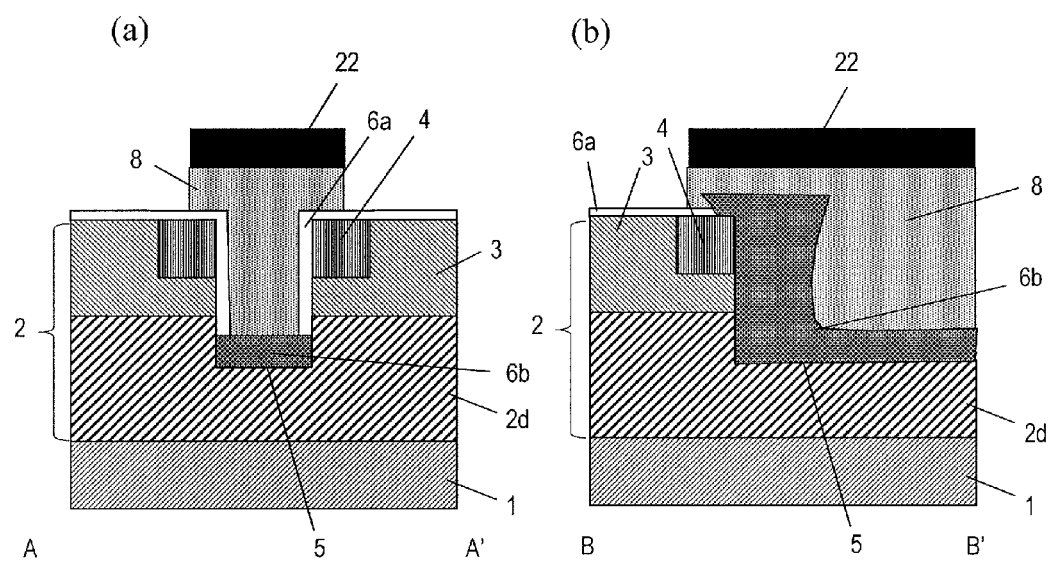
FIGS. 36 (*a*) and (*b*) are process cross-sectional views each illustrating a method for manufacturing a semiconductor device of the fourth embodiment.
Figure 37:
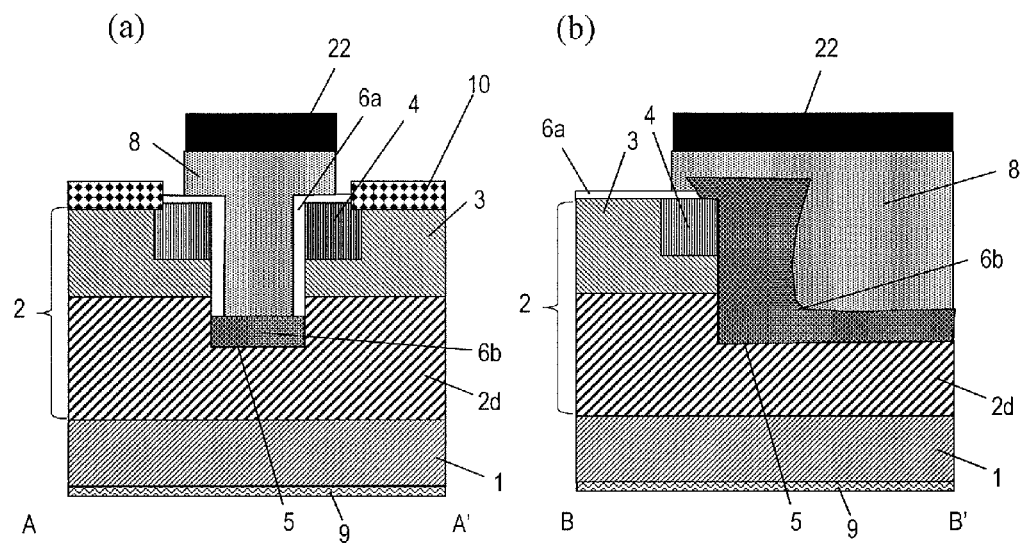
FIGS. 37 (*a*) and (*b*) are process cross-sectional views each illustrating a method for manufacturing a semiconductor device of the fourth embodiment.

FIGS. 28(a) and 28(b) are diagrams showing a trench and a gate insulating film arranged in a unit cell of a semiconductor device of the present embodiment, as seen from above. FIGS. 28(a) and 28(b) illustrates the planar shape of the trench 5 and the gate insulating film 6 arranged in a stripe-shaped cell and a rectangular cell, respectively. FIGS. 28(c) and 28(d) are cross-sectional views showing a unit cell of the semiconductor device of the present embodiment. FIG. 28(c) is a cross-sectional view taken along line A-A' of FIGS. 28(a) and 28(b), and FIG. 28(d) is a cross-sectional view taken along line B-B' of FIGS. 28(a) and 28(b). For the sake of simplicity, like elements to those of FIG. 1 will be denoted by like reference numerals and will not be described below.

In the semiconductor device of the present embodiment, the thicknesses Tc and Tb of the gate insulating film 6 on the corner side surfaces and on the bottom surface of the trench 5 are larger than the thickness Ts of the gate insulating film 6 on the main side surfaces (on the channel region). Therefore, it is possible to ease the electric field concentration occurring at the corner portions of the trench 5 and the bottom portion of the trench 5, thereby more effectively preventing dielectric breakdown.

The gate insulating film 6 of the present embodiment includes an insulating layer (first insulating layer) 6b formed through deposition on the side surface and the bottom surface of the trench 5, and an insulating layer (second insulating layer) 6a formed through by oxidizing a surface portion (silicon carbide) of the trench 5. An oxide film, a nitride film, or the like, may be used as the insulating layer 6b. Note that where a nitride film is used as the insulating layer 6b, the insulating layer (thermal oxidation film) 6a and the insulating layer 6b can be distinguished from each other.

Manufacturing Method of Fourth Embodiment

Next, referring to the drawings, an example of a method for manufacturing a semiconductor device of the present embodiment will be described.

FIGS. 29 to 37 are diagrams each illustrating a method for manufacturing a semiconductor device of the present embodiment. In each figure, (a) and (b) are cross-sectional views taken along line A-A' and line B-B', respectively, of FIGS. 28(a) and 28(b), and (c) is a plan view of the trench 5.

First, as shown in FIGS. 29(a) to 29(c), the silicon carbide layer 2 including the drift region 2d of the first conductivity type (herein, n type) and the body region of the second conductivity type (herein, p type) is obtained on the principal surface of the substrate 1, as in a conventional process. Then, the source region 4 is formed in the body region 3. After an annealing treatment is performed to activate the source region 4, the trench 5 is formed in the silicon carbide layer 2. The method for forming the silicon carbide layer 2 and the trench 5 is similar to the method described above with reference to FIG. 2.

Then, as shown in FIGS. 30(a) and 30(b), the insulating film 17 is formed on the side surface and the bottom surface of the trench 5. Herein, as the insulating film 17, an oxide film (thickness: about 600 nm, for example) containing an impurity (e.g., phosphorus), for example, is formed inside the trench 5 (the side surface and the bottom surface) and on the surface of the silicon carbide layer 2 by an LP-CVD method, for example. In this process, the thickness of the insulating film 17 and the width, the shape, and the like, of the trench 5 may be controlled so that the trench 5 is filled by the insulating film 17 and no voids are produced inside the trench 5.

Although not shown in the figures, the insulating film 17 buried in the trench 5 may include a slit. In such a case, although not shown in the figures, a heat treatment (annealing treatment) is performed so that the slit formed in the trench 5 disappears by virtue of mixing. Herein, a heat treatment is performed at a temperature of 800° C. for 60 minutes, for example. In the present embodiment, the insulating film 17 contains an impurity (phosphorus), and the melting point of the insulating film 17 is therefore decreased so that the insulating film 17 easily softens by a heat treatment. Therefore, atoms more easily travel through the insulating film 17 in the trench 5, thereby allowing the insulating film 17 to flow to fill the slit.

Note that where voids have been produced inside the insulating film 17, voids may possibly not disappear and remain despite mixing. Therefore, the formation of the insulating film 17 is performed herein by such a method and conditions that as few voids as possible will be contained.

While an impurity is introduced into the insulating film 17 so that mixing occurs more easily in the present embodiment, the insulating film 17 may include no impurity. While an oxide film deposited by an LP-CVD method is used as the insulating film 17, the method and material by which the insulating film 17 is formed are not limited to any method and material as long as the insulating film 17 can be deposited in the trench 5 without voids. The insulating film is not limited to an oxide film, and may be a nitride film, for example. Although the method for forming the insulating film 17 is not limited to any particular method, with an LP-CVD method, it is possible to form the insulating film 17 with a better coverage (a higher coverage for the side surface of the trench 5) than with other methods, the thickness of the insulating film 17 on the side surface of the trench 5 can be controlled with a higher precision. Where the insulating film 17 can be deposited without voids or slits, mixing does not need to be done, and it is therefore possible to skip the annealing treatment step (mixing step).

Thereafter, as shown in FIGS. 31(a) and 31(b), the surface of the insulating film 17 is flattened by the chemical mechanical polishing method (CMP), for example. Flattening is done for making flat the surface of the insulating film to be left unremoved in the bottom portion of the trench 5 in the subsequent etch-back step. Therefore, the flattening step can be skipped if the surface of the insulating film 17, after the deposition or after the annealing treatment, is sufficiently flat.

While the CMP method is used in the present embodiment, another flattening method may be used instead of the CMP method, e.g., after an organic film is applied and flattened on the surface of the insulating film 17, organic film and the insulating film 17 may be etched back at generally the same etching rate.

Then, as shown in FIGS. 32(a) to 32(c), a resist film is formed on the insulating film 17, and portions of the resist film are removed while leaving other portions that are located on the corner portions of the trench 5. Thus, a resist mask (referred to also as the third mask) 21 is obtained, which covers the corner portions of the trench 5 and exposes portions other than the corner portions.

Note that although not shown in the figures, where stripe-shaped cells are used, the resist mask 21 is formed on the insulating film 17, which has been formed inside the trench 5 and on the silicon carbide layer 2, so as to cover the terminal portions of the trench 5. Note that while the resist masks 21 covering two corner portions located at each terminal portion of the cell are separated from each other in the illustrated example, they may alternatively be connected to each other, as in the embodiments above.

Then, as shown in FIGS. 33(a) to 33(c), using the resist mask 21 as an etching mask, the insulating film 17 is etched. Herein, the insulating film 17 is etched by a combination of dry etching and wet etching. First, the insulating film 17 is etched by dry etching using a $CHF_3$ gas, or the like. The etching of the insulating film 17 is adjusted so that the insulating film 17 remains with a thickness of about 350 nm on the bottom surface of the trench 5. Note that the insulating film 17 located on the upper surface of the silicon carbide layer 2 is removed in this etching step except for portions thereof that are covered by the resist mask 21. Then, the insulating film 17 remains, as a side wall (not shown), on the main side surfaces of the trench 5. The side wall is removed by wet etching using an HF-based solution, for example. Thus, portions of the insulating film 17 that are exposed through the resist mask 21 are removed, while other portions thereof that are covered by the resist mask 21 are left unremoved and become the insulating layer 6b. Thus, the insulating layer 6b is obtained on the corner side surfaces of the trench 5.

While wet etching is herein used for the etching of the side wall, it is because a wet etching solution for an insulating film typically does not corrode silicon carbide. Note that the side wall may instead be removed by isotropic dry etching. In this case, a gas that does not etch silicon carbide may be selected.

Note that although not shown in the figures, where stripe-shaped cells are used, the insulating layer 6b is formed on the side surface at each corner portion of the trench 5 and on the bottom surface of the trench 5.

After removing the resist mask 21, the insulating layer 6b is formed in portions of the side surface and the bottom surface of the trench 5 that are not covered by the insulating layer 6b, as shown in FIGS. 34(a) to 34(c). Herein, a heat treatment is performed in a dry oxidation atmosphere at a temperature of 1200° C. for three hours, for example, thereby oxidizing silicon carbide on the surface of the trench 5, thus obtaining the insulating layer (thickness: 70 nm, for example) 6a. Thus, the gate insulating film 6 is obtained, which includes the insulating layers 6a and 6b. The thickness of the insulating layer 6a (the thickness of the insulating layer 6a on the channel region) is designed in accordance with the characteristics of the semiconductor device. On the other hand, the thickness of the insulating layer 6b is designed in view of preventing dielectric breakdown, and is larger than the thickness of the insulating layer 6a. Note that also in the present embodiment, as in the embodiments above, the thickness of the insulating layer 6a formed by a heat treatment may vary due to the surface orientation dependence of the oxidation rate of silicon carbide.

Thereafter, as shown in FIGS. 35(a) and 35(b), an electrode material (e.g., doped polysilicon) to be the gate electrode is deposited in the trench 5 and on the upper surface of the silicon carbide layer 2, thereby obtaining a conductive film 8'.

Then, by a method similar to those of the embodiments above, the conductive film 8' is dry-etched by using a resist mask 22 that covers the trench 5 and the surrounding area and that is open in the other area, as shown in FIGS. 36(a) and 36(b), thereby obtaining the gate electrode 8. Thereafter, as shown in FIGS. 37(a) and 37(b), the source electrode 10 is formed on the silicon carbide layer 2. Then, the drain electrode 9 is formed on the reverse side of the substrate 1 (the surface opposite to the principal surface). Thus, a semiconductor device of the present embodiment is completed.

According to the method described above, the gate insulating film 6, which is thicker on the corner side surfaces and the bottom surface of the trench 5 than on the main side surfaces thereof, can be formed without complicating the manufacturing process. Therefore, it is possible to prevent the thinning of the gate insulating film 6 due to the surface orientation occurring on corner side surfaces of the trench 5. As a result, it is possible to effectively ease the electric field concentration at the corner portions and the bottom portion of the trench 5. Moreover, since it is also possible to ease the electric field concentration occurring in the bottom portion of the trench 5, it is possible to more effectively prevent dielectric breakdown.

With the method described above, the thickness of portions (the insulating layer 6b) of the gate insulating film 6 that are located on the corner side surfaces of the trench 5 can be controlled by the pattern of the resist mask 21. On the other hand, the thickness of portions of the gate insulating film 6 that are located on the main side surfaces (particularly, on the channel region) (the insulating layer 6a) can be controlled by the conditions for forming the thermal oxidation film, or the like. Thus, the thicknesses of the gate insulating film 6 at different positions can be controlled independently of each other, and it is therefore possible to prevent dielectric breakdown while ensuring desirable transistor characteristics.

The thickness of the gate insulating film 6 is not limited to the thickness shown in the method described above. The range of the thickness of the trench 5 on the main side surfaces (particularly, the thickness on the channel region) Ts and the thickness Tc of the trench 5 on the corner side surfaces is similar to the range described above in the first embodiment above. The thickness Tb in the bottom portion of the trench 5 is 150 nm or more and 400 nm or less, for example. The thickness Tb is preferably 3 times or more the thickness Ts, and more preferably 5 times or more the thickness Ts. Note that the thickness Tb is set so that the upper surface of the gate insulating film 6 formed on the bottom surface of the trench 5 is located at least below the lower surface of the body region 3 (i.e., below the channel region).

As described above, as the gate insulating film 6 is formed in two steps in the trench 5, even on the crystal plane having the same surface orientation, it is possible to form a gate insulating film that is thicker in particular portions than in other portions.

Therefore, according to the first to fourth embodiments, irrespective of the surface orientation of the side surface of the trench 5, the thickness of the gate insulating film 6 can be made thicker on the corner side surfaces of the trench 5 than on the main side surfaces thereof. The difference Tc−Ts between the thickness Tc of the gate insulating film 6 on the corner side surfaces of the trench 5 and the thickness Ts thereof on the main side surfaces is greater than the thermal oxidation film thickness difference caused by the oxidation rate which depends on the surface orientation between the corner side surfaces and the main side surfaces, even if the oxidation rate of the corner side surfaces is greater than the oxidation rate of the main side surfaces. Thus, it is possible to prevent a decrease in threshold value or electric field concentration, which occurs because the gate insulating film 6 is thinner at corner portions.

The thickness of the gate insulating film 6 in the bottom portion of the trench 5 may be greater than the thickness of the gate insulating film 6 on the main side surfaces of the trench 5. Then, it is possible to simultaneously ease not only the electric field concentration in the corner portions of the trench 5 but also that in the bottom portion of the trench 5. Note that where the gate insulating film 6 is not made thick in the bottom portion of the trench 5, other countermeasures may taken for the purpose of easing the electric field concentration in the bottom portion of the trench 5, e.g., forming an impurity layer on the silicon carbide layer 2.

Although the embodiments described above have been directed to examples where the trench 5 is in a stripe shape or a rectangular shape as seen from a direction vertical to the principal surface of the substrate 1, the trench 5 may be in another shape, e.g., a polygonal shape such as pentagon or hexagon.

The corner side surfaces of the trench 5 may not have a depressed portion. For example, a stripe-shaped trench 5A shown in FIG. 43(a) and a rectangular trench 5B shown in FIG. 43(c) have a depressed portion R at the corner side surface. When such trenches 5A and 5B are subjected to a thermal oxidation process, gate insulating films 6A and 6B are obtained in the trenches 5A and 5B, respectively. The gate insulating films 6A and 6B are thicker in portions on the corner side surfaces than on the main side surfaces. However, if cells are further miniaturized, such minute depressed portions R can no longer be formed. Since the size of the trench increases by the size of the depressed portion R, it is difficult in the first place to miniaturize unit cells. Since the depressed portion R is narrower than the trench width, a high electric field intensity may act thereon. In contrast, according to the embodiments described above, such problems as described above can be avoided since the corner side surfaces of the trench 5 do not have a depressed portion as shown in FIGS. 43(b) and 43(d). On the corner side surfaces, the gate insulating film 6 may be thickened toward the inside of the trench 5. That is, where the trench 5 is rectangular or polygonal, the surface of the gate insulating film 6 on the corner side surfaces of the trench 5 may be located more on the inner side than the surface of the gate insulating film 6 on the main side surfaces of the trench 5, as shown in FIG. 43(d). Thus, the gate insulating film 6 can be made thicker on the corner side surfaces without increasing the size of the trench 5, and it is possible to ease the electric field concentration at corner portions.

While the first and second embodiments described above are directed to a case where the depth of the trench 5 is 1.5 μm, similar effects can be obtained as long as the depth of the trench 5 is such that it reaches the n-type drift region 2d and a desirable insulating film can be formed in the bottom portion of the trench 5. Moreover, while the third and fourth embodiments are directed to a case where the thickness of the insulating film 17 is 600 nm, the insulating film 17 may have any thickness such that the trench groove 5 can be completely filled. Typically, the thickness of the insulating film 17 is preferably 50 to 100% the width of the trench 5, though it may vary depending on the width of the trench 5. Note that the width of the trench 5 refers to the maximum width of the opening of the trench 5 as seen from a direction normal to the principal surface of the substrate 1.

While the first to fourth embodiments are directed to a case where the side surface of the trench 5 is vertical, similar effects can be obtained even when the trench groove has a taper angle. Moreover, while the p-type body region 3 is formed through epitaxial growth, it may alternatively be formed by ion implantation to the silicon carbide layer 2. The impurity concentration and the thickness of the drift region 2d are determined based on the desirable peak inverse voltage, and are not limited to the values illustrated in the embodiments described above.

Moreover, while the insulating layer 6a is formed by oxidizing the surface of silicon carbide, the insulating layer 6a may alternatively be deposited by using a CVD method, or the like.

While the side surface and the bottom surface of the trench 5 vertically intersect with each other, thereby forming corner portions in the cross-sectional views shown in FIGS. 1 to 37, the side surface and the bottom surface do not need to vertically intersect with each other if the trench 5 has a tapered shape. Effects similar to those described above can be obtained also when the corner portions are rounded through etching or a step other than etching.

Moreover, while a 4h-SiC substrate is used as the substrate 1, another crystal plane or another poly-type SIC substrate may be used. Where a 4h-SiC substrate is used, the silicon carbide layer 2 may be formed on the Si plane thereof and the drain electrode 9 on the C plane thereof, or the silicon carbide layer 2 may be formed on the C plane and the drain electrode 9 on the Si plane.

The configuration of the semiconductor device according to an embodiment of the present invention is not limited to the configuration described above. While the silicon carbide layer 2 includes the body region 3, the source region 4 and the drift region 2d in the semiconductor device shown in FIG. 1, other elements may be further included. For example, an impurity layer of the second conductivity type for easing the electric field may be provided in a portion of the drift region 2d that is located in the vicinity of the bottom surface of the trench 5. A channel layer may be formed on the side surface of the trench 5.

While the semiconductor devices of the embodiments described above are each a MISFET having an inversion channel structure, one aspect of the present invention may include a MISFET having an accumulation channel structure. Effects similar to those described above can be obtained also in such a case.

FIGS. 38(a) and 38(b) are cross-sectional views illustrating a MISFET having an accumulation channel structure. For the sake of simplicity, like elements to those of FIG. 1 will be denoted by like reference numerals and will not be described below.

Figure 38:
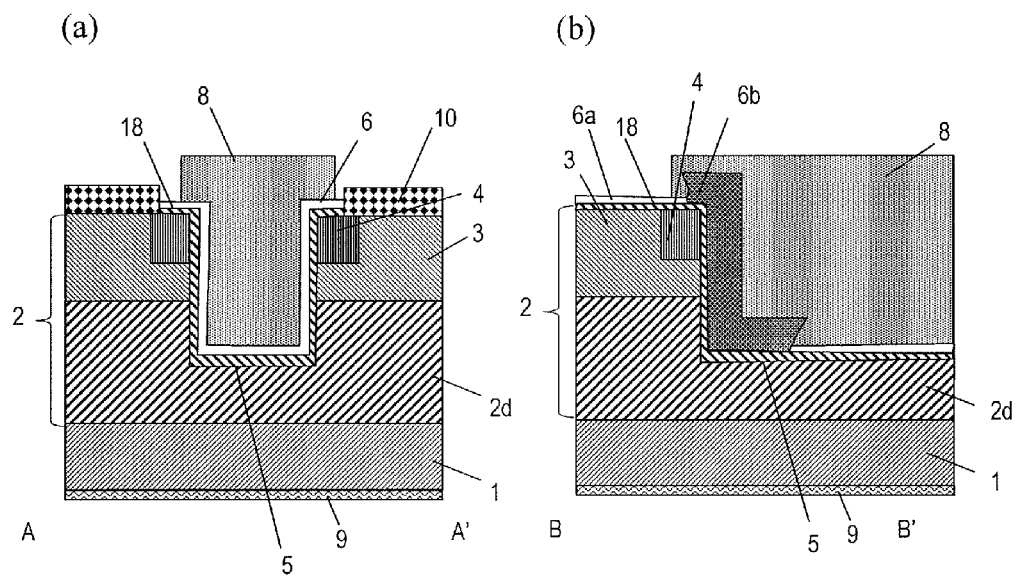
FIGS. 38 (*a*) and (*b*) are cross-sectional views each illustrating a semiconductor device having an accumulation channel structure according to an embodiment of the present invention.

In a unit cell of a semiconductor device shown in FIG. 38, a channel layer 18 of silicon carbide is formed on the bottom surface and the side surface of the trench 5. The channel layer 18 is a silicon carbide layer of the first conductivity type formed through epitaxial growth, for example. A film that is formed by a method similar to those of the gate insulating film 6 of the first to fourth embodiments described above and that has a similar configuration may be used as the gate insulating film 6.

The method for manufacturing the semiconductor device shown in FIG. 38 may be similar to the methods for manufacturing the semiconductor devices of the first to fourth embodiments. Note however that before the formation of the gate insulating film 6, the channel layer 18 is formed through epitaxial growth on the silicon carbide layer 2, and the main side surfaces, the corner side surfaces and the bottom surface of the trench 5. Then, the gate insulating film 6 is formed on the channel layer 18. Where the gate insulating film 6, which includes the insulating layers 6a and 6b, is formed, the insulating layer 6b is formed, and then the surface portion of the channel layer 18 is oxidized so as to obtain the insulating layer 6a.

The embodiments of the present invention are not limited to vertical MISFETs, but may include various semiconductor devices having a structure in which an electrode is arranged on a silicon carbide layer with an insulating film interposed therebetween. For example, while a MISFET is manufactured by using a silicon carbide substrate of the same conductivity type as the silicon carbide layer (the drift region) in the embodiments above, an insulated gate bipolar transistor (IGBT) can be manufactured using a silicon carbide substrate of a different conductivity type from that of the silicon carbide layer (the drift region).

Note that with an IGBT, the source electrode, the drain electrode and the source region in each of the embodiments described above are called an emitter electrode, a collector electrode and an emitter region, respectively. Moreover, an n-type IGBT can be obtained by setting the conductivity type of the drift region and the emitter region to n type and the conductivity type of the substrate and the body region to p type in the embodiments described above. In this case, an n-type buffer layer may be arranged between the p-type substrate and the n-type drift layer. A p-type IGBT can be obtained by setting the conductivity type of the drift region and the emitter region to p type, and the conductivity type of the substrate and the body region to n type. In this case, a p-type buffer layer may be arranged between the n-type substrate and the p-type drift layer.

While the embodiments described above are directed to a semiconductor device using silicon carbide (SiC), the present invention is also applicable to semiconductor device using another wide band gap semiconductor, e.g., GaN, AlN, diamond, etc., and similar effects to those described above can be obtained.

INDUSTRIAL APPLICABILITY

With a semiconductor device according to one embodiment of the present invention, the gate insulating film can be made thicker on the corner side surfaces of the trench than on the main side surfaces, it is possible to reduce the electric field intensity at corner portions of the trench while ensuring desirable characteristics, thereby preventing dielectric breakdown.

The present invention is widely applicable to semiconductor devices, such as MISFETs, having a trench structure, and to various controller devices and driver devices including the same. Particularly, the present invention can suitably be used for a semiconductor device using a wide band gap semiconductor such as silicon carbide.

REFERENCE SIGNS LIST

1 Substrate
2 Silicon carbide layer
2d Drift region
3 Body region
4 Source region
5 Trench
6 Gate insulating film 6a, 6b Insulating layer
8 Gate electrode
9 Drain electrode
10 Source electrode
12 Ion implanted region
13 Side wall
14 Mask material layer
21 Resist mask

The invention claimed is:

1. A semiconductor device comprising:
a substrate;
a semiconductor layer of a wide band gap semiconductor arranged on a principal surface of the substrate;
a trench arranged in the semiconductor layer and including a bottom surface, a plurality of side surfaces, and a plurality of corner portions each connecting together two adjacent side surfaces, wherein the trench has a polygonal shape having n apexes and n sides as seen from a direction vertical to the principal surface of the substrate, the plurality of corner portions being n corner portions, one of the plurality of corner portions being located at each of the n apexes of the polygonal shape, the plurality of side surfaces being n side surfaces, and one of the plurality of side surfaces being located along each of the n sides of the polygonal shape;
a gate insulating film arranged on the bottom surface, the plurality of side surfaces and the plurality of corner portions of the trench, and a portion of a surface of the semiconductor layer located in a peripheral portion of the trench at the plurality of corner portions; and
a gate electrode arranged in the trench and being insulated from the semiconductor layer by means of the gate insulating film, wherein:
the semiconductor layer includes a drift region of a first conductivity type, and a body region of a second conductivity type arranged on the drift region;
the trench runs through the body region and has the bottom surface inside the drift region;
the plurality of corner portions of the trench do not have a depressed portion;
the gate insulating film is thicker on the plurality of corner portions of the trench and the portion of the surface of the semiconductor layer located in the peripheral portion of the trench at the plurality of corner portions than on at least some of the plurality of side surfaces of the trench;
portions of the gate insulating film located on the plurality of corner portions and the portion of the surface of the semiconductor layer located in the peripheral portion of the trench at the plurality of corner portions are a first insulating layer, and portions of the gate insulating film located on the at least some side surfaces are a second insulating layer;
the first insulating layer is arranged so as to cover a plurality of shoulder portions of the trench, the shoulder portions connecting together the surface of the semiconductor layer located on the peripheral portion of the trench and the plurality of corner portions; and
the first insulating layer is a deposited film, and the second insulating layer is a thermal oxidation film, the second insulating layer being provided only in portions of the surface of the trench where the first insulating layer is absent.

2. The semiconductor device of claim 1, wherein the gate insulating film is thicker on the bottom surface of the trench than on the side surfaces of the trench.

3. The semiconductor device of claim 1, wherein a surface of a portion of the gate insulating film that is located on the corner portions is more inside of the trench than a surface of a portion thereof that is located on the side surfaces.

4. The semiconductor device of claim 1, wherein the trench has a stripe shape as seen from a direction vertical to the principal surface of the substrate, and the corner portions are located at terminal portions of the stripe shape.

5. The semiconductor device of claim 1, wherein a thickness Tc of the gate insulating film on the corner portions is 1.5 times or more as large as a thickness Ts thereof on the side surfaces.

6. The semiconductor device of claim 2, wherein a thickness Tb of the gate insulating film on the bottom surface is 3 times or more as large as a thickness Ts thereof on the side surfaces.

7. The semiconductor device of claim 1, wherein a carbon concentration of the first insulating layer is lower than a carbon concentration of the second insulating layer.

8. A method for manufacturing a semiconductor device, the method comprising the steps of:
(a) providing a substrate including a semiconductor layer of a wide band gap semiconductor formed on a principal surface thereof, the semiconductor layer including a drift region of a first conductivity type, and a body region of a second conductivity type arranged on the drift region;
(b) forming a trench on the semiconductor layer, the trench having a surface including a bottom surface, a plurality of side surfaces, and a plurality of corner portions each connecting together two adjacent side surfaces, wherein the trench runs through the body region and has the bottom surface inside the drift region, and wherein the trench has a polygonal shape having n apexes and n sides as seen from a direction vertical to the principal surface of the substrate, the plurality of corner portions being n corner portions, one of the plurality of corner portions being located at each of the n apexes of the polygonal shape, the plurality of side surfaces being n side surfaces, and one of the plurality of side surfaces being located along each of the n sides of the polygonal shape;
(c) forming a first insulating layer in contact with the semiconductor layer by depositing an insulative material on the plurality of corner portions of the trench and a portion of a surface of the semiconductor layer located in a peripheral portion of the trench at the plurality of corner portions, wherein the first insulating layer is formed so as to cover a plurality of shoulder portions of the trench, the shoulder portions connecting together the surface of the semiconductor layer located on the peripheral portion of the trench and the plurality of corner portions, and is not formed on at least portions of the plurality of side surfaces of the trench;
(d) forming a second insulating layer thinner than the first insulating layer only on portions of the surface of the trench where the first insulating layer is absent by oxidizing the wide band gap semiconductor on the at least portions of the side surfaces of the trench, thereby obtaining a gate insulating film including the first insulating layer and the second insulating layer, the gate insulating film being thicker on the plurality of corner portions of the trench and the portion of the surface of the semiconductor layer located in the peripheral portion of the trench at the plurality of corner portions than on the at least portions of the side surfaces; and
(e) forming a gate electrode to be in contact with the gate insulating film in the trench.

9. The method for manufacturing a semiconductor device of claim 8 wherein the step (c) comprises the steps of, (c1) forming an insulating film on the side surfaces, the corner portions and the bottom surface of the trench;

(c2) forming a third mask on the insulating film, wherein the third mask covers the corner portions of the trench while exposing portions thereof other than the corner portions, as seen from a direction vertical to a principal surface of the substrate; and (c3) forming the first insulating layer by etching the insulating film using the third mask as an etching mask.

10. The method for manufacturing a semiconductor device of claim 9, wherein in the step (c1), the insulating film is formed so that an inside of the trench is filled by the insulating film.

11. The method for manufacturing a semiconductor device of claim 10, wherein in the step (c3), the insulating film is etched so that a portion of the insulating film is left unremoved in a bottom portion of the trench, thereby forming the first insulating layer on the corner portions and the bottom surface of the trench.

12. The method for manufacturing a semiconductor device of claim 10, further comprising a step of performing a heat treatment between the step (c1) and the step (c2), wherein the insulating film is an impurity-doped oxide film.

13. The method for manufacturing a semiconductor device of claim 9, wherein the step (c2) comprises the steps of:

(c21) forming a mask material film on the insulating film;

(c22) forming a fourth mask on the mask material film, wherein the fourth mask covers corner portions of the trench while exposing portions thereof other than the corner portions, as seen from a direction vertical to a principal surface of the substrate; and (c23) forming the third mask by etching the mask material film so that a portion of the mask material film is left unremoved in a bottom portion of the trench using the fourth mask as an etching mask, wherein in the step (c3), the first insulating layer is formed on the corner portions and the bottom surface of the trench.

14. The semiconductor device of claim 1, wherein the trench has a rectangular shape as seen from a direction vertical to the principal surface of the substrate.

15. The method for manufacturing a semiconductor device of claim 8, wherein the trench has a rectangular shape as seen from a direction vertical to the principal surface of the substrate.

16. The semiconductor device of claim 1, wherein:

the second insulating layer is located on each of the plurality of side surfaces of the trench; and the gate insulating film is thicker on the plurality of corner portions of the trench than on any of the plurality of side surfaces of the trench.

17. The method for manufacturing a semiconductor device of claim 8, wherein:

in the step (d), the second insulating layer is formed on each of the plurality of side surfaces of the trench; and a gate insulating film is obtained, which is thicker on the plurality of corner portions of the trench than on any of the plurality of side surfaces.

* * * * *